(12) United States Patent  (10) Patent No.: US 7,532,996 B2
Kobayashi et al.  (45) Date of Patent: May 12, 2009

(54) SEMICONDUCTOR INTEGRATED CIRCUIT

(75) Inventors: Hiroyuki Kobayashi, Kawasaki (JP); Atsumasa Sako, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/589,068

(22) Filed: Oct. 30, 2006

(65) Prior Publication Data

US 2007/0043522 A1  Feb. 22, 2007

Related U.S. Application Data

(62) Division of application No. 10/980,293, filed on Nov. 4, 2004, now Pat. No. 7,149,644.

(30) Foreign Application Priority Data

Nov. 5, 2003  (JP) .............................. 2003-375276
Jun. 25, 2004  (JP) .............................. 2004-187938

(51) Int. Cl.
*G01K 1/00*  (2006.01)
(52) U.S. Cl. ..................................... 702/130
(58) Field of Classification Search .................. 702/130
See application file for complete search history.

(56) References Cited

U.S. PATENT DOCUMENTS

| 4,730,228 | A |   | 3/1988  | Einzinger et al. |        |
|-----------|---|---|---------|------------------|--------|
| 5,278,796 | A |   | 1/1994  | Tillinghast et al. |      |
| 5,495,452 | A | * | 2/1996  | Cha ............. | 365/222 |
| 5,600,281 | A |   | 2/1997  | Mori et al.      |        |
| 5,875,142 | A |   | 2/1999  | Chevallier       |        |
| 6,134,167 | A |   | 10/2000 | Atkinson         |        |
| 6,134,667 | A |   | 10/2000 | Suzuki et al.    |        |
| 6,281,760 | B1 | * | 8/2001 | Koelling et al. ............... | 331/66 |
| 6,489,831 | B1 |   | 12/2002 | Matranga et al. |        |
| 6,667,925 | B2 | * | 12/2003 | Kobayashi et al. .......... | 365/211 |
| 6,921,199 | B2 |   | 7/2005  | Aota et al.      |        |
| 7,196,956 | B2 | * | 3/2007  | Shirota et al. ............... | 365/211 |
| 2003/0123520 | A1 |   | 7/2003 | Tesi           |        |
| 2005/0063234 | A1 | * | 3/2005 | Sinha et al. ................. | 365/222 |

FOREIGN PATENT DOCUMENTS

| JP | 3-207084 A | 9/1991  |
| JP | 5-266658 A | 10/1993 |
| JP | 7-73668 A  | 3/1995  |

* cited by examiner

*Primary Examiner*—Tung S Lau
*Assistant Examiner*—Aditya Bhat
(74) *Attorney, Agent, or Firm*—Arent Fox LLP

(57) ABSTRACT

A temperature detector sets the level of a temperature detecting signal to a level indicating a high temperature state, detecting that the chip temperature is higher than a first boundary temperature. The temperature detector sets the level of thereof to a level indicating a low temperature state, detecting that the chip temperature is lower than a second boundary temperature. A control circuit changes its operating state according to the level of the temperature detecting signal. This prevents the operating state of the control circuit from frequently switched even when the chip temperature fluctuates around the boundary temperatures, and accordingly reduces current consumption of the control circuit due to the switching operation. Further, the first and second boundary temperatures set a buffer zone, so that the temperature detector does not detect power supply noises as temperature variation. This can prevent malfunction of the temperature detector and the semiconductor integrated circuit.

9 Claims, 24 Drawing Sheets

SEMICONDUCTOR INTEGRATED CIRCUIT

CROSS REFERENCE TO RELATED APPLICATION

This application is a Divisional Application which claims the benefit of prior U.S. patent application Ser. No. 10/980,293, filed Nov. 4, 2004 now U.S. Pat. No. 7,149,644, which claims the benefit of priority from Japanese Patent Application No. 2003-375276, filed on Nov. 5, 2003 and No. 2004-187938, filed on Jun. 25, 2004. The disclosures of the prior applications are hereby incorporated herein in their entirety by reference.

BACKGROUND OF THE INVENTION

1. Field of the Invention

The present invention relates to a semiconductor integrated circuit having a temperature detector.

2. Description of the Related Art

An SRAM has been conventionally used as a work memory of portable equipment such as a cellular phone. However, memory capacity necessary for portable equipment has been increasing year after year. Therefore, a DRAM having dynamic memory cells or a pseudo SRAM is adopted as a work memory in recent years. A DRAM can have larger memory capacity as a work memory with the same cost since a memory cell thereof is smaller than a memory cell of the SRAM.

Meanwhile, a memory mounted on a cellular phone needs to be low in power consumption in order to make the battery life long. A low standby current is especially important in a cellular phone in order to increase the continuous standby time. The DRAM and the pseudo SRAM require regular refresh operation of memory cells even while the portable equipment is in nonoperation, and the refresh operation is a factor of increasing the standby current. Therefore, various methods are devised in order to reduce the standby current in the DRAM and the pseudo SRAM.

For example, some technique has been proposed for reducing the standby current, by taking advantage of the characteristics of the dynamic memory cell that has the data retention time which gets longer as the chip temperature is higher, and setting a long refresh interval when the chip temperature is lower than a certain boundary temperature to reduce the frequency of the refresh operation (disclosed in, for example, Japanese Unexamined Patent Application Nos. Hei 5-266658, Hei 7-73668, and Hei 3-207084).

FIG. 1 shows temperature-dependent data retention time of a dynamic memory cell. As described above, the lower the chip temperature is, the longer the data retention time of the dynamic memory cell is. It is possible to reduce the standby current by changing the refresh interval according to the boundary temperature Tth detected by a temperature detector.

FIG. 2 shows a problematic example of a conventional semiconductor integrated circuit having a temperature detector. When the semiconductor integrated circuit operates around a boundary temperature Tth, an output of the temperature detector varies in a short cycle if heat generation due to the operation of internal circuits and heat release due to operation termination of the internal circuits are repeated. As a result, a control circuit connected to an output of the temperature detector changes its operating state (low power operation and normal operation) in response to the output of the temperature detector. This switching operation increases current consumption of the control circuit, so that an effect of reducing the standby current is lowered.

FIG. 3 shows another example of a problem of the conventional semiconductor integrated circuit having the temperature detector. When the operation and nonoperation of the internal circuits of the semiconductor integrated circuit are repeated around the boundary temperature Tth, the temperature detector sometimes malfunctions since it detects power supply noises as temperature variation. Therefore, the output of the temperature detector varies with a short cycle. At this time, since, as in FIG. 2, the operating state of the control circuit connected to the output of the temperature detector is switched over with a short cycle, current consumption of the control circuit increases. Further, the operating state of the control circuit shown in FIG. 3 is switched over irrespective of the chip temperature, so that the semiconductor integrated circuit malfunctions.

SUMMARY OF THE INVENTION

It is an object of the present invention to reduce current consumption of a semiconductor integrated circuit having a temperature detector.

It is another object of the present invention to prevent malfunction of a temperature detector due to noises, thereby preventing malfunction of a semiconductor integrated circuit.

According to one of the aspects of the semiconductor integrated circuit of the present invention, a temperature detector sets the level of a temperature detecting signal to a level indicating a high temperature state when detecting that a chip temperature shifts from low to high and is higher than a first boundary temperature. Further, the temperature detector sets the level of the temperature detecting signal to a level indicating a low temperature state when detecting that the chip temperature shifts from high to low and is lower than a second boundary temperature that is different from the first boundary temperature. A control circuit changes its own operating state according to the level of the temperature detecting signal.

In the semiconductor integrated circuit described above, the boundary temperature based on which the operating state of the control circuit is changed from a certain state to another state is different from the boundary temperature based on which the operating state of thereof is changed from another state to a certain state, so that it is able to prevent the operating state of the control circuit from frequently switched over even when the chip temperature fluctuates around the boundary temperature. As a result, current consumption of the control circuit due to the switching operation can be reduced. Further, since the first boundary temperature and the second boundary temperature set a buffer zone, the temperature detector does not detect power supply noises or the like generated due to the operation of internal circuits as temperature variation. As a result, it is possible to prevent malfunction of the temperature detector and of the semiconductor integrated circuit.

According to another aspect of the semiconductor integrated circuit of the present invention, the temperature detector maintains the level of the temperature detecting signal while the chip temperature is between the first boundary temperature and the second boundary temperature.

In the semiconductor integrated circuit described above, maintaining the level of the temperature detecting signal while the chip temperature is between the first boundary temperature and the second boundary temperature makes it possible to prevent the operating state of the control circuit from frequently switched over, which can reduce current consumption due to the switching of the control circuit.

According to another aspect of the semiconductor integrated circuit of the present invention, the temperature detector has a temperature detecting unit, a first differential amplifier, a second differential amplifier, and a flipflop. The temperature detecting unit has a resistor and a bipolar transistor that are connected in series between a power supply line and a ground line, and generates a detection voltage corresponding to the chip temperature from a connecting node of the resistor and the bipolar transistor. The first differential amplifier compares a first reference voltage corresponding to the first boundary temperature with the detection voltage. The second differential amplifier compares a second reference voltage corresponding to the second boundary temperature with the detection voltage. The flipflop generates the level of the temperature detecting signal according to results of the comparisons from the first and second differential amplifiers.

In the semiconductor integrated circuit described above, it is possible to monitor the chip temperature as the detection voltage by taking advantage of temperature-dependent changes in a threshold voltage of the bipolar transistor. The first and second differential amplifiers are used to compare the detection voltage with the first and second reference voltages corresponding to the first and second boundary temperatures respectively, which makes it possible to detect the change in the chip temperature accurately with a simple circuit and to surely switch over the operating state of the control circuit.

According to another aspect of the semiconductor integrated circuit of the present invention, the temperature detector has a temperature detecting unit, a basic differential amplifier, a first differential amplifier, a second differential amplifier, and a flipflop. The temperature detecting unit has a resistor and a bipolar transistor that are connected in series between a power supply line and a ground line, and generates a detection voltage corresponding to the chip temperature from a connecting node of the resistor and the bipolar transistor. The basic differential amplifier compares a basic reference voltage and the detection voltage to output a result of the comparison as a basic detection voltage. The first differential amplifier compares a first reference voltage corresponding to the first boundary temperature with the basic detection voltage. The second differential amplifier compares a second reference voltage corresponding to the second boundary temperature with the basic detection voltage. The flipflop generates the level of the temperature detecting signal according to results of the comparisons from the first and second differential amplifiers.

Moreover, the change in the detection voltage (basic detection voltage) inputted to the first and second differential amplifiers is made steep by the basic differential amplifier's amplification of the detection voltage outputted from the temperature detecting unit. This enables secure generation of the temperature detecting signal when the first and second boundary temperatures are close to each other, even if the fluctuation or others in the manufacturing conditions of the semiconductor integrated circuit causes variances in the characteristics of the first and second differential amplifiers, and the variances cause an offset voltage.

According to another aspect of the semiconductor integrated circuit of the present invention, a resistor array is constituted of a plurality of resistors arranged in series between the power supply line and the ground line. The resistor array generates the first and second reference voltages from connecting nodes of predetermined resistors respectively. A variable resistor unit is connected in series to the resistor array and a resistance value thereof is changeable. The first and second reference voltages are adjusted by changing the resistance value of the variable resistor. Therefore, it is possible to form a circuit in which the first and second reference voltages are adjustable without any increase in the circuit scale.

According to another aspect of the semiconductor integrated circuit of the present invention, a first variable resistor and a second variable resistor are disposed on a power supply line side and a ground line side of the resistor array, which enables easy and fine adjustment of the first and second reference voltages.

According to another aspect of the semiconductor integrated circuit of the present invention, a sum of resistance values of the first and second variable resistors is always made constant, which makes it possible to make constant a difference between the first and second reference voltages to increase or decrease the first and second reference voltages. As a result, the temperature detector can change the level of a temperature detecting signal whenever a certain degree of temperature change occurs.

According to another aspect of the semiconductor integrated circuit of the present invention, the resistance value of the variable resistor unit is preset by a ROM circuit. This makes it possible to manufacture a semiconductor integrated circuit with an optimum characteristic which generates the first and second reference voltages with optimum values according to a fluctuation in manufacturing conditions or to product specifications.

According to another aspect of the semiconductor integrated circuit of the present invention, a voltage generator generates a plurality of kinds of voltages. A switch circuit selects two kinds from the plurality of kinds of voltages to output the selected voltages as a first and a second reference voltage. A ROM circuit presets the voltages to be selected by the switch circuit.

In the semiconductor integrated circuit described above, plurality of the first and second reference voltages can be generated by selecting the switch circuit according to values set by the ROM circuit. This makes it possible to manufacture a semiconductor integrated circuit with an optimum characteristic in conformity with fluctuations in the manufacturing conditions and with the product specifications.

According to another aspect of the semiconductor integrated circuit of the present invention, a memory array has dynamic memory cells. The control circuit is a refresh timer configured to change a generation cycle of a refresh request signal for refreshing the memory cell, according to the level of the temperature detecting signal.

In the semiconductor integrated circuit described above, the refresh cycle of the memory cell is changed according to the chip temperature, which makes it possible to reduce power consumption of the semiconductor integrated circuit.

According to another aspect of the semiconductor integrated circuit of the present invention, a command decoder decodes a read command signal and a write command signal that are access requests supplied via an external terminal. An operation control circuit outputs a timing signal for putting the memory array into operation in order to execute an access operation in response to the read command signal and the write command signal and a refresh operation in response to the refresh request signal. The operation control circuit has an arbiter configured to determine which one of the access operation and the refresh operation is to be given priority when the read command signal or the write command signal conflict with the refresh request signal.

The refresh timer can be operated efficiently to reduce standby current since the semiconductor integrated circuit described above has the arbiter configured to determine which of the access operation and the refresh operation is executed first when the read command or the write command conflict with the refresh command.

According to another aspect of the semiconductor integrated circuit of the present invention, during a normal operation mode, a command decoder decodes a read command signal and a write command signal that are access requests supplied via an external terminal and a self refresh command signal for changing the normal operation mode to a self refresh mode. An operation control circuit outputs a timing signal for putting the memory array into operation in order to execute an access operation in response to the read command signal and the write command signal and a refresh operation in response to the refresh request signal. A refresh timer starts operating when the command decoder decodes the self refresh command signal.

In the semiconductor integrated circuit described above, it is possible to efficiently operate the refresh timer to reduce standby current (self refresh current) since the semiconductor integrated circuit has the self refresh mode.

According to another aspect of the semiconductor integrated circuit of the present invention, after shifting to the self-refresh mode from the normal operation mode, the refresh timer fixes the generation cycle of the refresh request signal to a short cycle irrespective of the level of the temperature detecting signal until it generates a predetermined number of refresh request signals. After completion of the generation, the refresh timer changes the generation cycle according to the level of the temperature detecting signal. The internal circuits of the semiconductor integrated circuit are sometimes in an unstable state immediately after shifting to the self-refresh mode, and the oscillation cycle of a self timer is sometimes unstable. In such cases, fixing the generation cycle of the refresh request signal to a short cycle makes it possible to prevent loss of data retained in memory cells. Therefore, it is possible to improve reliability of the data retained in the memory cells.

According to another aspect of the semiconductor integrated circuit of the present invention, after the level change in the temperature detecting signal, the refresh timer change the generation cycle of the refresh request signal after it generates a predetermined number of refresh request signals. Changing the generation cycle with a time lag since the level change in the temperature detecting signal can surely prevent the temperature detector and the semiconductor integrated circuit from malfunctioning even if the temperature detector frequently makes a detection due to power supply noises and the like.

According to another aspect of the semiconductor integrated circuit of the present invention, the generation cycle is lengthened not after the level change in the temperature detecting signal due to the chip temperature shift from high to low, but after completion of generation of a predetermined number of refresh request signals according to the level change. Further, after the level change in the temperature detecting signal due to the chip temperature shift from low to high, the generation cycle is shortened in response the level change. When the level of the temperature detecting signal changes due to the shift of the chip temperature from high to low, that is, reliability of data retained in memory cells is lowered, delaying the shift timing can prevent deterioration in the reliability of data retained in the memory cells.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
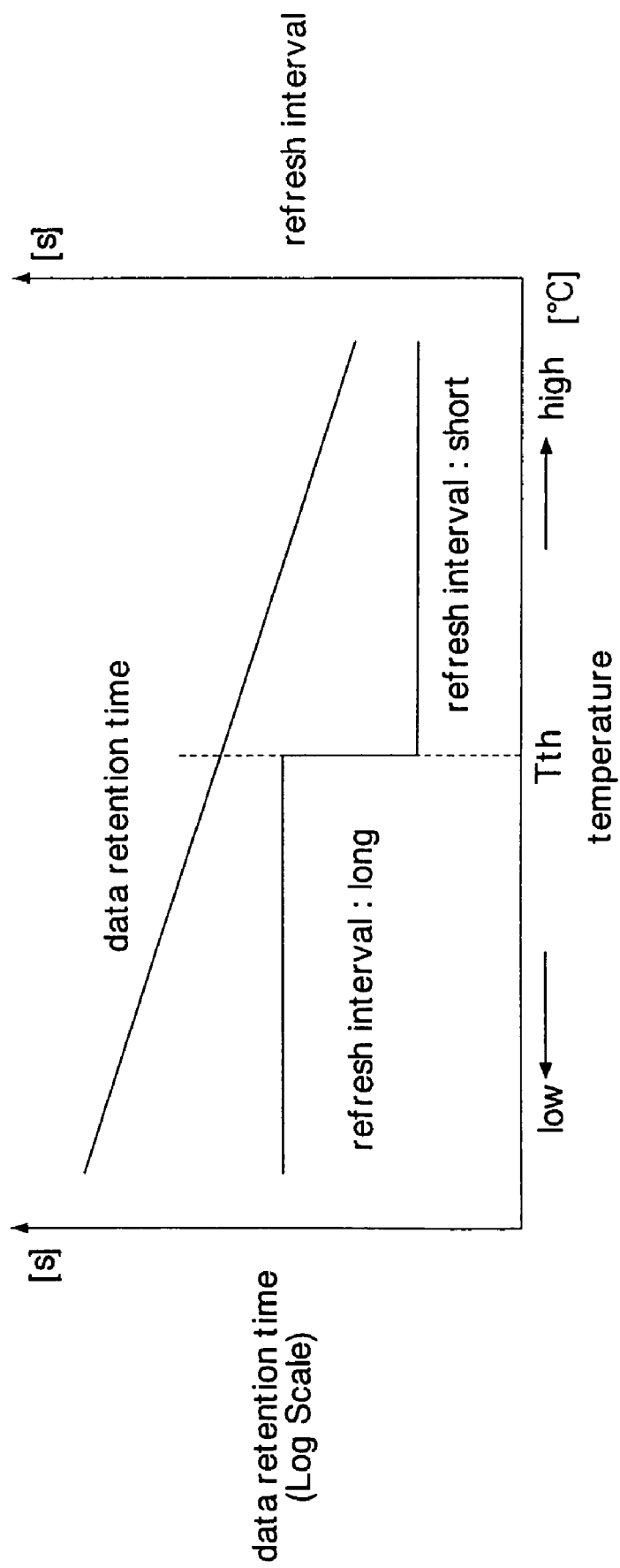
FIG. 1 is a characteristic chart showing temperature-dependent data retention time of a dynamic memory cell.
Figure 2:
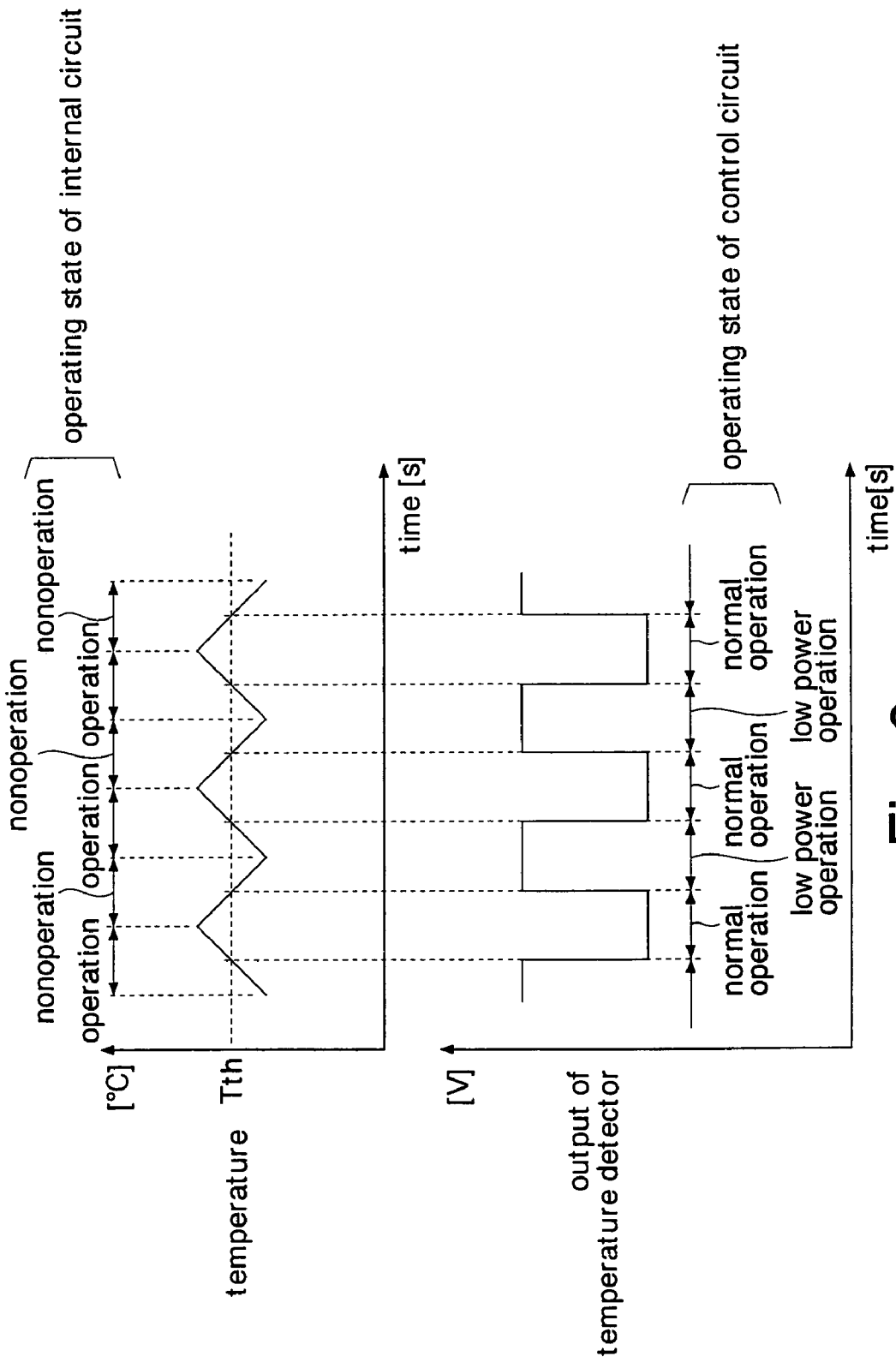
FIG. 2 is an explanatory chart showing a problematic example of a conventional semiconductor integrated circuit having a temperature detector.
Figure 3:
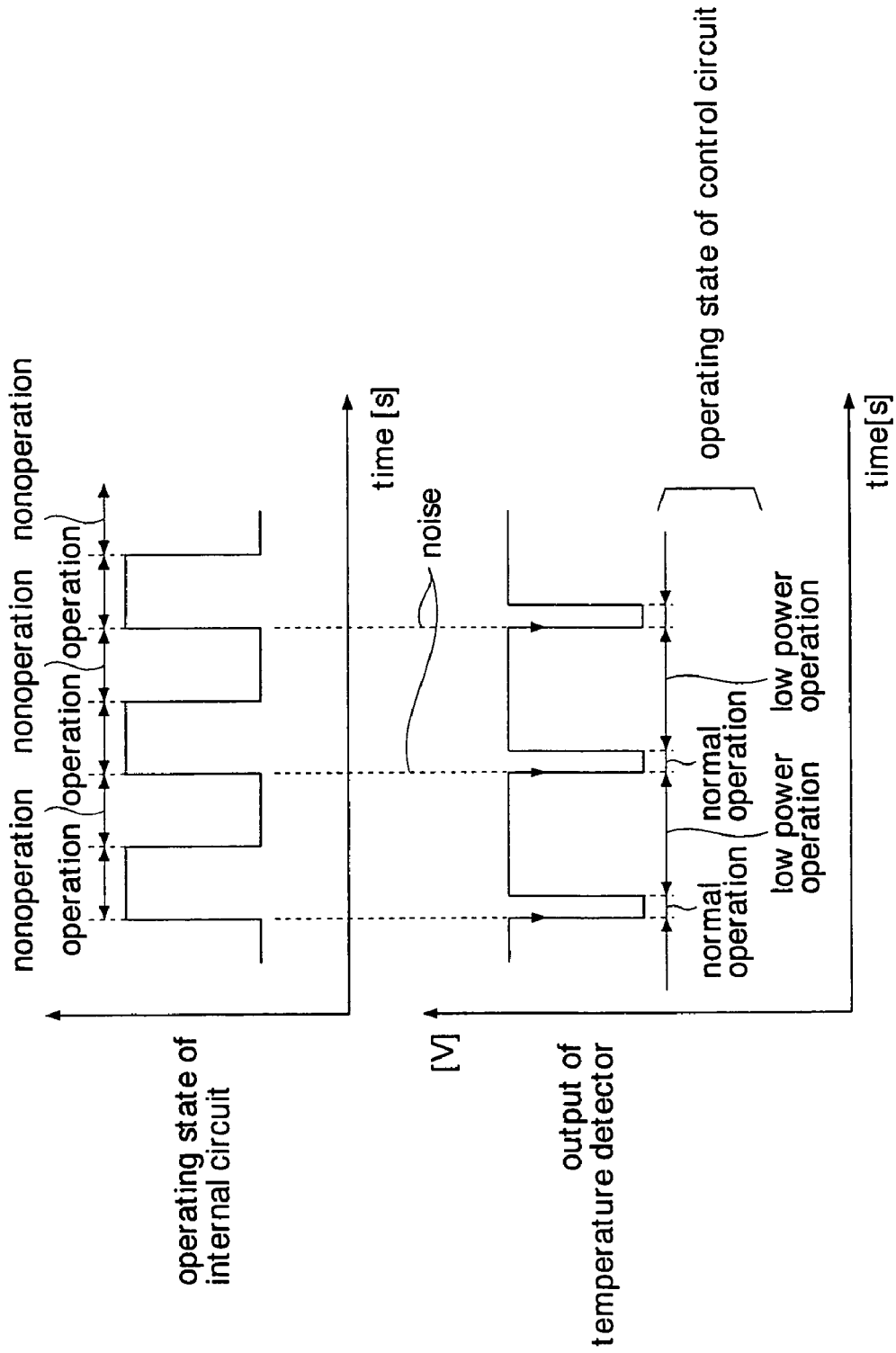
FIG. 3 is an explanatory chart showing another problematic example of the conventional semiconductor integrated circuit having the temperature detector.

Hereinafter, embodiments of the present invention will be explained using the drawings. The double circles in the drawings represent external terminals. In the drawings, each signal line shown by the heavy line is constituted of a plurality of lines. Part of a block to which the heavy line is connected is constituted of a plurality of circuits. The same reference numerals and symbols as those of the external terminals are used to designate signals supplied via the external terminals. The same reference numerals and symbols as those of the signals are used to designate signal lines through which the signals are transmitted.

Figure 4:
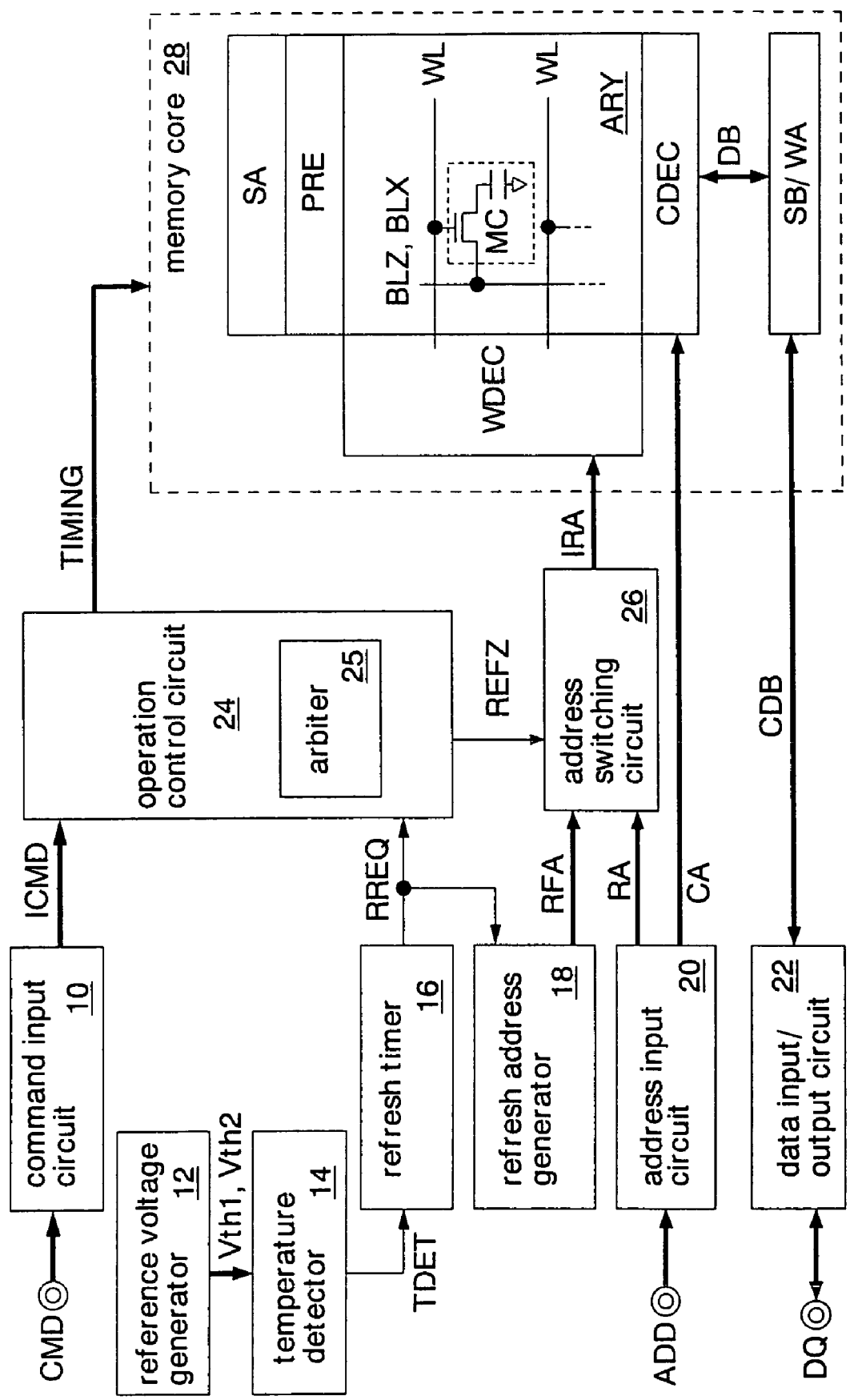
FIG. 4 is a block diagram showing a first embodiment of the semiconductor integrated circuit of the present invention.

FIG. 4 shows a first embodiment of the semiconductor integrated circuit of the present invention. This semiconductor integrated circuit is formed on a silicon substrate as a pseudo SRAM, using a CMOS process. The pseudo SRAM has a memory core of a DRAM and an interface of an SRAM. The pseudo SRAM executes a refresh operation periodically inside a chip without receiving an external refresh command and retains data written to memory cells. The pseudo SRAM is used as a work memory mounted on, for example, a cellular phone. A read operation and a write operation are executed in response to command signals CMD (a read command signal and a write command signal) supplied via an external terminal.

The pseudo SRAM has a command input circuit 10, a reference voltage generator 12, a temperature detector 14, a refresh timer 16, a refresh address generator 18, an address input circuit 20, a data input/output circuit 22, an operation control circuit 24, an address switching circuit 26, and a memory core 28. Note that only essential signals necessary for explaining the present invention are shown in FIG. 4.

The command input circuit 10 (command decoder) receives the command signal CMD (for example, a chip enable signal /CE, a write enable signal /WE, an output enable signal /OE, or the like) supplied via a command terminal. The command input circuit 10 decodes the received command signal CMD (access request) to output an internal command signal ICMD for putting the memory core 28 into operation.

The reference voltage generator 12 generates a threshold voltage Vth1 (first reference voltage) and a threshold voltage Vth2 (second reference voltage). The threshold voltages Vth1, Vth2 correspond to a first boundary temperature Tth1 and a second boundary temperature Tth2 which will be described later, respectively.

The temperature detector 14 sets a temperature detecting signal TDET to low level indicating a high temperature state when detecting that the chip temperature of the pseudo SRAM shifts from a low temperature to a high temperature to be higher than the boundary temperature Tth1 (represented by the threshold voltage Vth1). The temperature detecting circuit 14 sets the level of the temperature detecting signal TDET to high level indicating a low temperature state when detecting that the chip temperature shifts from a high temperature to a low temperature to be lower than the boundary temperature Tth2 (represented by the threshold voltage Vth2). The temperature detector 14 maintains the level of the temperature detecting signal TDET when the chip temperature is between the boundary temperatures Tth1, Tth2. The boundary temperature Tth1 is higher than the boundary temperature Tth2.

The refresh timer 16 generates in a predetermined cycle a refresh request signal RREQ for refreshing a memory cell MC. The refresh timer 16 sets a timer cycle long when the temperature detecting signal TDET is at high level and sets the timer cycle short when the temperature detecting signal TDET is at low level. In other words, the output frequency of the refresh request signal RREQ is low when the chip temperature is low and is high when the chip temperature is high.

The refresh address generator 18 executes a count operation in response to the refresh request signal RREQ to output a refresh address signal RFA constituted of a plurality of bits. The refresh address signal RFA is a row address signal for selecting a word line WL.

The address input circuit 20 receives an address signal ADD supplied from an address terminal and outputs the received signal as a row address signal RA and a column address signal CA. The row address signal RA is used for selecting the word line WL. The column address signal CA is used for selecting a bit line BLZ (or BLX).

The data input/output circuit 22 outputs read data, which is transferred from the memory core 28 via a common data bus CDB, to a data terminal DQ (for example, 16 bits) at the time of the read operation. The data input/output circuit 22 receives write data supplied via the data terminal DQ to transfer the received data to the memory core 28 via the common data bus CDB at the time of the write operation.

The operation control circuit 24 has an arbiter 25 that determines to which one of the internal command signal ICMD and the refresh request signal RREQ, which are inputted asynchronously, priority should be given when they conflict with each other. The operation control circuit 24 outputs a refresh signal REFZ when the refresh operation is executed in response to the refresh request signal RREQ. The refresh operation is executed by the arbiter 25 between the read operations or the write operations executed in response to the read command or the write command supplied from an external part of the pseudo SRAM. In other words, the refresh operation is automatically executed inside the pseudo SRAM. The operation control circuit 24 outputs a timing signal TIMING for determining the operation timing of a plurality of control circuits (a word decoder WDEC, a sense amplifier SA, and so on to be described later) in the memory core 28, in response to the internal command signals ICMD (the read command signal and the write command signal) or the refresh request signal RREQ (refresh command signal) to which the arbiter 25 has determined to give priority.

The address switching circuit 26 outputs the row address signal RA as an internal row address signal IRA while receiving the low level refresh signal REFZ (during the read operation, the write operation, or a standby period). The address switching circuit 26 outputs the refresh address signal RFA as the internal row address signal IRA while receiving the high level refresh signal RFEZ (during the refresh operation). This means that the externally supplied row address signal RA is selected during the read operation, the write operation, and the standby period, and the internally generated refresh address signal RFA is selected during the refresh operation.

The memory core 28 has the word decoder WDEC, the sense amplifier SA, a precharging circuit PRE, a memory array ARY, a column decoder CDEC, a sense buffer SB, and a write amplifier WA. The operating timings of the circuits except the memory array ARY are set by the timing signals TIMING respectively.

The word decoder WDEC selects the word line WL corresponding to the internal row address signal IRA. The sense amplifier SA amplifies a voltage difference between bit lines BLZ, BLX at the time of the read operation, the write operation, and the refresh operation. The precharging circuit PRE sets the bit lines BLZ, BLX to predetermined voltages while the memory core 28 is in nonoperation.

During the read operation and the write operation, the column decoder CDEC selects a column switch for connecting the bit lines BLZ, BLX and the data bus DB according to the column address signal CA, and turns on the selected column switch in synchronization with a column line control signal CLZ. The sense buffer SB amplifies a signal amount of the read data on the data bus DB at the time of the read operation to output it to the common data bus CDB. The write amplifier WA amplifies a signal amount of the write data on the common data bus CDB at the time of the write operation to output it to the data bus DB.

The memory array ARY has the plural dynamic memory cells MC arranged in matrix, and the plural word lines WL and the plural bit line pairs BLZ, BLX connected to the memory cells MC. Each of the memory cells MC, which are the same as typical DRAM memory cells, has a capacitor (memory node) for retaining data as charges and a transfer transistor disposed between this capacitor and the bit line BL. A gate of the transfer transistor is connected to the word line WL.

Figure 5:
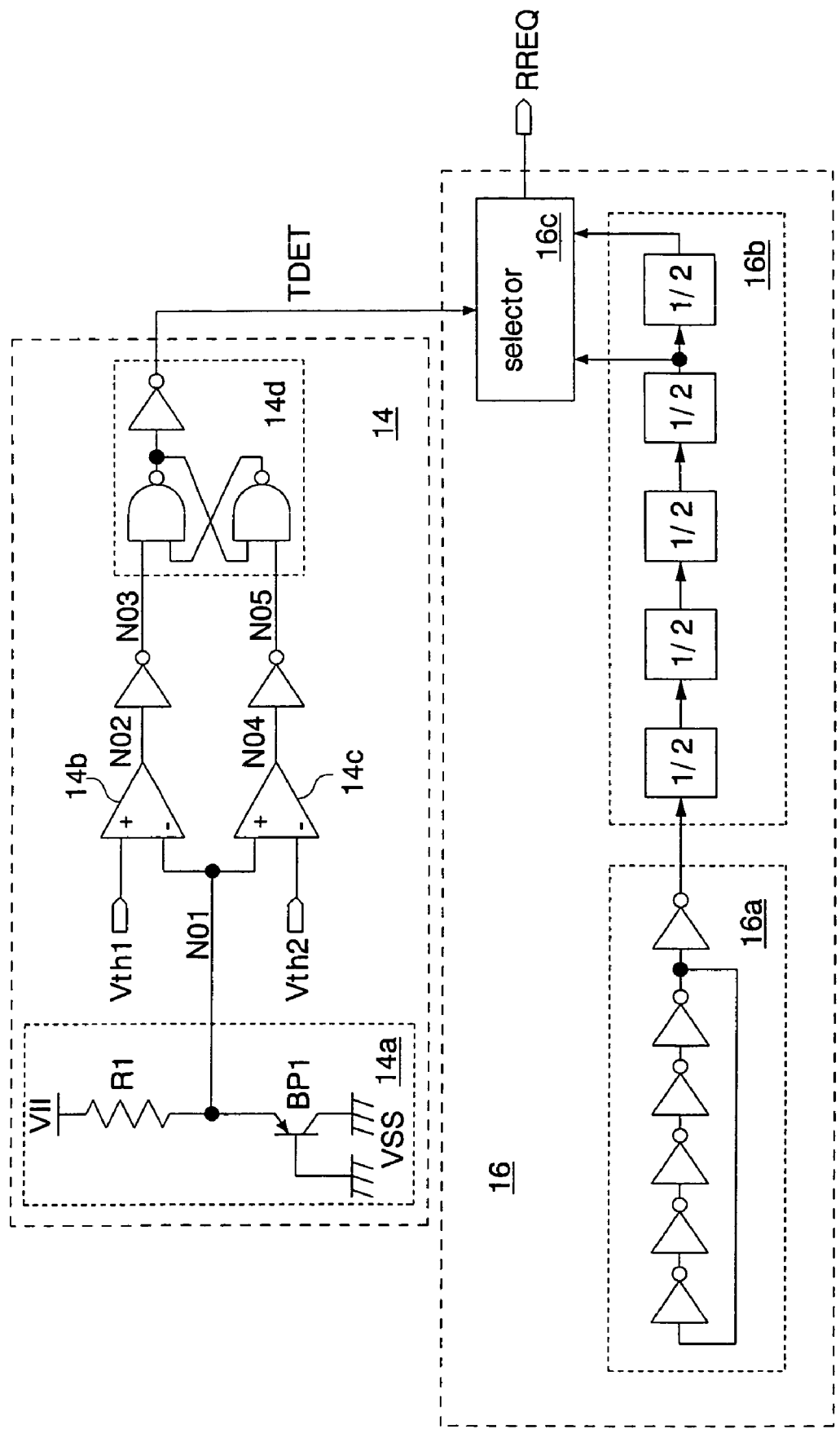
FIG. 5 is a block diagram showing a temperature detector and a refresh timer shown in FIG. 4 in detail.

FIG. 5 shows the temperature detector 14 and the refresh timer 16 shown in FIG. 4 in detail. The temperature detector 14 has a temperature detecting unit 14a, a first differential amplifier 14b, a second differential amplifier 14c, a flipflop 14d, and so on. The temperature detecting unit 14a has a resistor R1 (for example a diffusion resistance) and a bipolar transistor BP1 that are connected between an internal power supply line VII and a ground line VSS. The temperature detecting unit 14a generates a detection voltage corresponding to the chip temperature from a connecting node N01 of the resistor R1 and the bipolar transistor BP1. For example, a threshold voltage of the bipolar transistor BP1 lowers as the chip temperature rises, therefore, voltage drops at the node N01.

The differential amplifier 14b compares the threshold voltage Vth1 representing the first boundary temperature Tth1 and the detection voltage N01. An output node N02 of the differential amplifier 14b changes to high level when the detection voltage N01<the threshold voltage Vth1, and changes to low level when the detection voltage N01>the threshold voltage Vth1. The differential amplifier 14c compares the threshold voltage Vth2 representing the second boundary temperature Tth2 and the detection voltage N01. An output node N04 of the differential amplifier 14c changes to high level when the detection voltage N01>the threshold voltage Vth2, and changes to low level when the detection voltage N01<the threshold voltage Vth2. Inverters connected to outputs of the differential amplifiers 14b, 14c, respectively, form and invert waveforms of the nodes N02, N04 and output the inverted waveforms to the flipflop 14d via nodes N03, N05.

The flipflop 14d changes the temperature detecting signal TDET to low level when the node N03 changes from high level to low level, and changes the temperature detecting signal TDET to high level when the node N05 changes from high level to low level.

The refresh timer 16 has a ring oscillator 16a, a frequency divider 16b, and a selector 16c. The ring oscillator 16a has inverters of odd-number stages connected in cascade and outputs an oscillation signal with a predetermined cycle. The frequency divider 16b has ½ frequency dividers of plural stages connected in cascade for dividing the frequency of the oscillation signal. The selector 16c selects either one of the frequency divided signals outputted from predetermined two of the ½ frequency dividers according to the logic level of the temperature detecting signal TDET and outputs the selected frequency divided signal as the refresh request signal RREQ.

Note that the ½ frequency dividers outputting the frequency divided signals to be inputted to the selector 16c are not limited to the two ½ frequency dividers shown in the drawing but may be determined according to the design and specifications of the pseudo SRAM.

Figure 6:
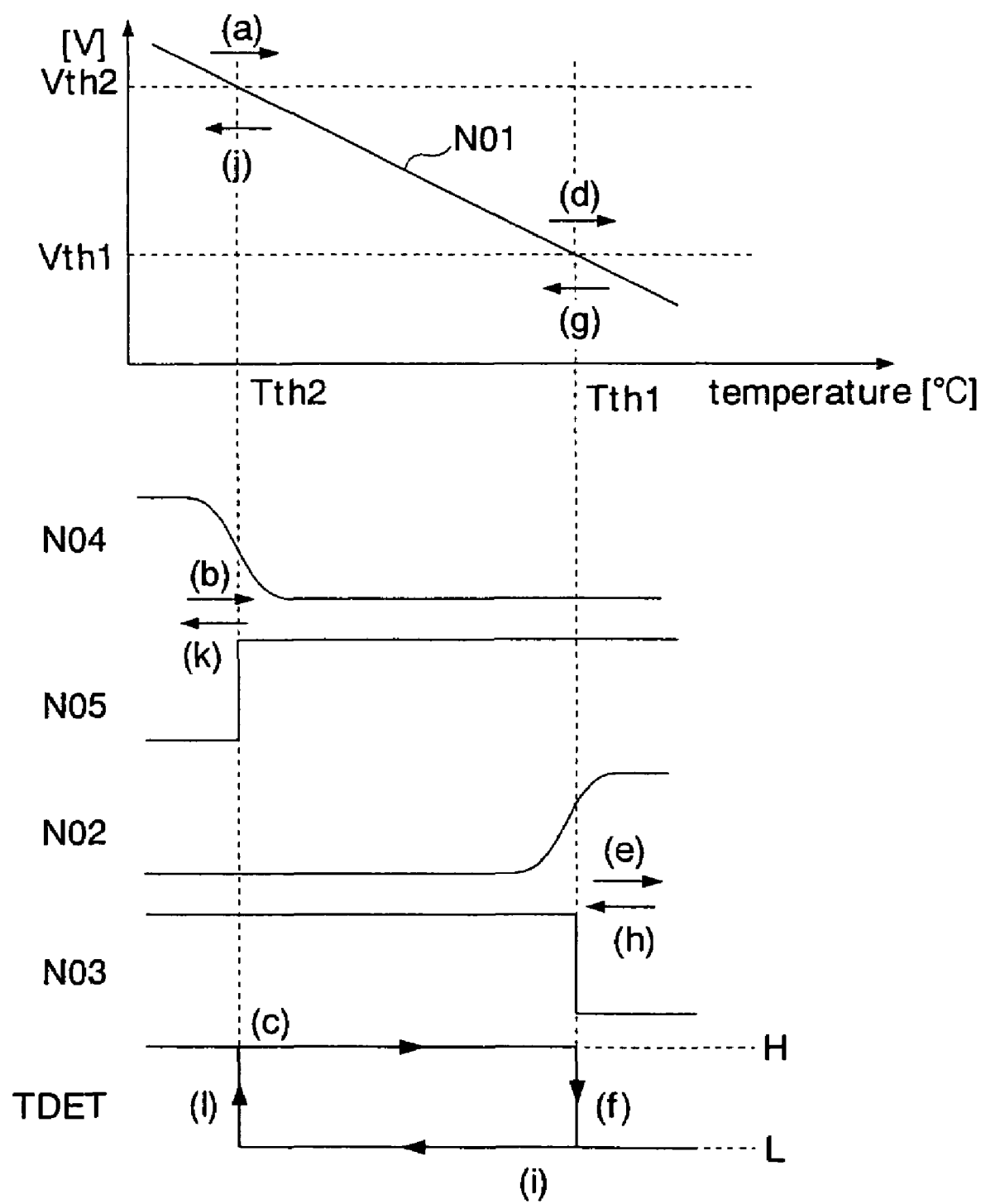
FIG. 6 is a waveform chart showing the operation of the temperature detector shown in FIG. 5.

FIG. 6 shows the operation of the temperature detector 14 shown in FIG. 5. The temperature detecting unit 14a shown in FIG. 5 generates a voltage in the node N01 according to the chip temperature. When the chip temperature changes from a low temperature to a high temperature to exceed the boundary temperature Tth2 (FIG. 6 (a)), the output node N04 of the differential amplifier 14c changes from high level to low level, and the node N05 changes from low level to high level (FIG. 6 (b)). At this time, since the node N03 is at high level, an output (TDET) of the flipflop 14d maintains high level (FIG. 6 (c)).

When the chip temperature changes from a low temperature to a high temperature to exceed the boundary temperature Tth1 (FIG. 6 (d)), the output node N02 of the differential amplifier 14b changes from low level to high level, and the node N03 changes from high level to low level (FIG. 6 (e)). At this time, since the node N0S is at high level, the output (TDET) of the flipflop 14d changes from high level to low level (FIG. 6 (f)).

Conversely, when the chip temperature changes from a high temperature to a low temperature to be lower than the boundary temperature Tth1 (FIG. 6 (g)), the output node N02 of the differential amplifier 14b changes from high level to low level, and the node N03 changes from low level to high level (FIG. 6 (h)). At this time, since the node N05 is at high level, the output (TDET) of the flipflop 14d maintains low level (FIG. 6 (i)).

When the chip temperature changes from a high temperature to a low temperature to be lower than the boundary temperature Tth2 (FIG. 6 (j)), the output node N04 of the differential amplifier 14c changes from low level to high level, and the node N05 changes from high level to low level (FIG. 6 (k)). At this time, since the node N03 is at high level, the output (TDET) of the flipflop 14d changes from low level to high level (FIG. 6 (l)). Thus, the temperature detector 14 has a Schmitt trigger function and the temperature detecting signal TDET indicates a preceding value when the chip temperature is between the boundary temperatures Tth1, Tth2.

Figure 7:
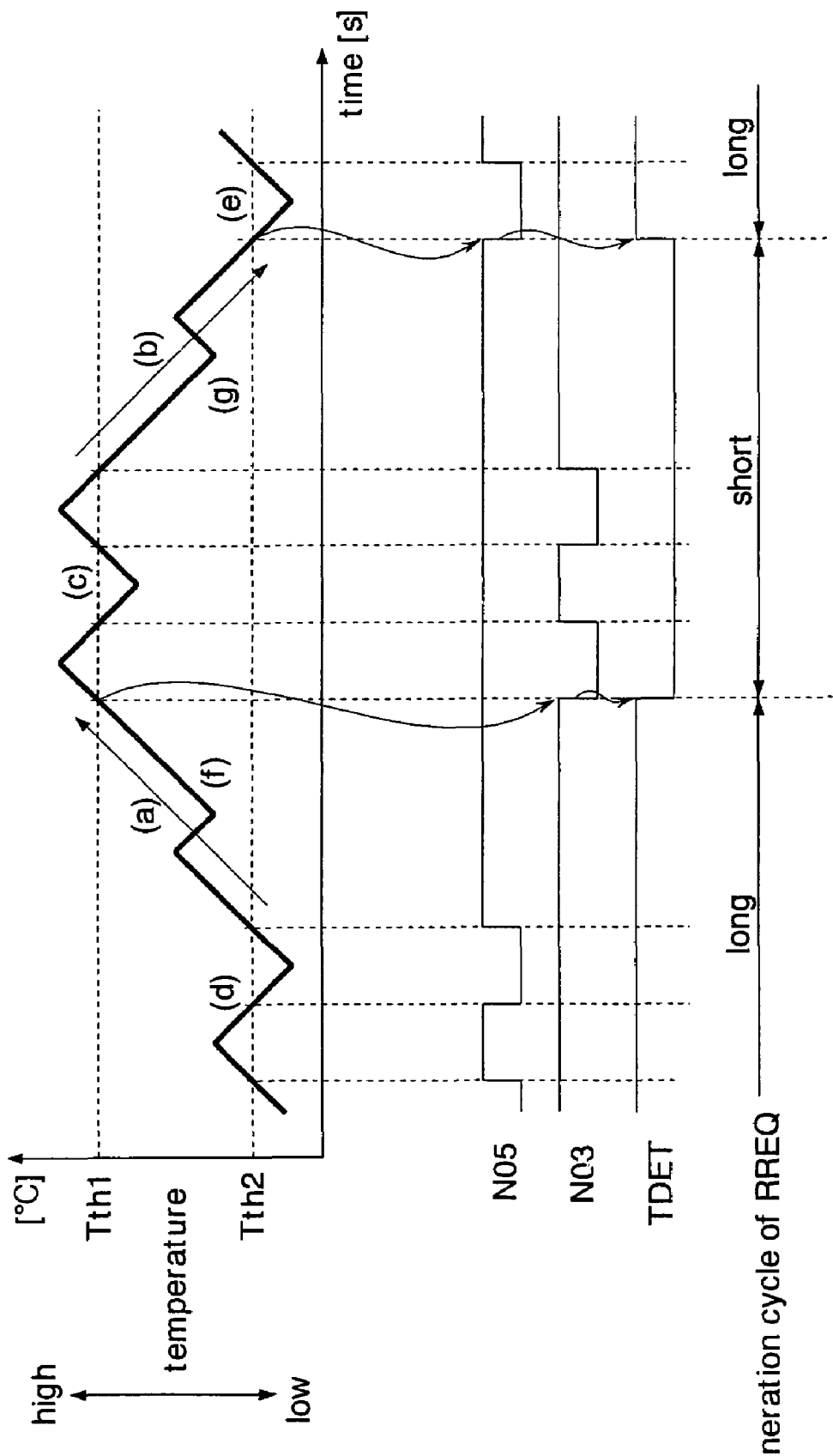
FIG. 7 is a waveform chart showing the operation of the temperature detector and the refresh timer according to variation in chip temperature in the first embodiment.

FIG. 7 shows the operation of the temperature detector 14 and the refresh timer 16 according to the change in the chip temperature in the first embodiment. The temperature detecting signal TDET changes from high level to low level only when the chip temperature exceeds the boundary temperature Tth2 and further exceeds Tth1 (FIG. 7 (a)). Further, the temperature detecting signal TDET changes from low level to high level only when the chip temperature goes lower than the boundary temperature Tth1 and further goes lower than Tth2 (FIG. 7 (b)). In other words, when the chip temperature fluctuates around the boundary temperature Tth1 (FIG. 7 (c)), the boundary temperature Tth2 (FIGS. 7 (d, e)), and between the boundary temperatures Tth1, Tth2 (FIGS. 7 (f, g)), the level of the temperature detecting signal TDET does not change. In this manner, in the present invention the boundary temperatures Tth1, Tth2 set a buffer zone, so that it is possible to prevent the output level of the temperature detecting signal TDET from frequently changing due to slight change in the chip temperature or power supply noises that are caused by the operation of the internal circuits of the pseudo SRAM. Therefore, the operation of the temperature detector 14 can be more stabilized. As a result, it is possible to prevent malfunction of the temperature detector 14, thereby preventing malfunction of the pseudo SRAM.

When the temperature detecting signal TDET is at high level, the refresh timer 16 makes the generation interval of the refresh request signal RREQ longer. At a low chip temperature, the data retention time of the memory cell MC gets long, so that data retained in the memory cell MC are not lost even the refresh frequency is lowered. On the other hand, At a high chip temperature, the data retention time of the memory cell MC gets short, so that it is necessary to prevent loss of the data retained in the memory cell MC by increasing the refresh frequency. The change in the refresh frequency according to the chip temperature makes it possible to prevent unnecessary operation of the refresh timer 16 and so on to reduce the standby current. Moreover, it is possible to prevent the refresh cycle from frequently switched when the temperature fluctuates around the boundary temperature Tth1 or Tth2. Consequently, it is able to prevent increase in current consumption of the temperature detector 14 and the refresh timer 16 and increase in the standby current which are caused by the switching operation.

In this embodiment described above, the logic level of the temperature detecting signal TDET outputted by the temperature detector 14 is changed using the two boundary temperatures Tth1, Tth2 as references, and the logic level of the temperature detecting signal TDET is maintained when the chip temperature is between the boundary temperatures Tth1, Tth2, which makes it possible to prevent frequently changing the cycle of the refresh request signal RREQ even when the chip temperature fluctuates around the boundary temperature Tth1 or Tth2. As a result, it is possible to lower the frequency of the switching operation in the refresh timer 16 for changing the cycle of the refresh request signal RREQ (the refresh cycle of the memory cell MC). Therefore, it is possible to reduce the standby current of the pseudo SRAM having the arbiter 25 that determines the order in which the access operation and the refresh operation are executed.

The temperature detecting unit 14a of the temperature detector 14 is capable of monitoring the chip temperature as the detection voltage N01 by utilizing the temperature dependent change in the threshold voltage of the bipolar transistor BP1. Further, the differential amplifiers 14b, 14c compare the detection voltage N01 with the threshold voltages Vth1, Vth2 corresponding to the boundary temperatures Tth1, Tth2 respectively, so that the change in the chip temperature can be detected accurately with a simple circuit.

Figure 8:
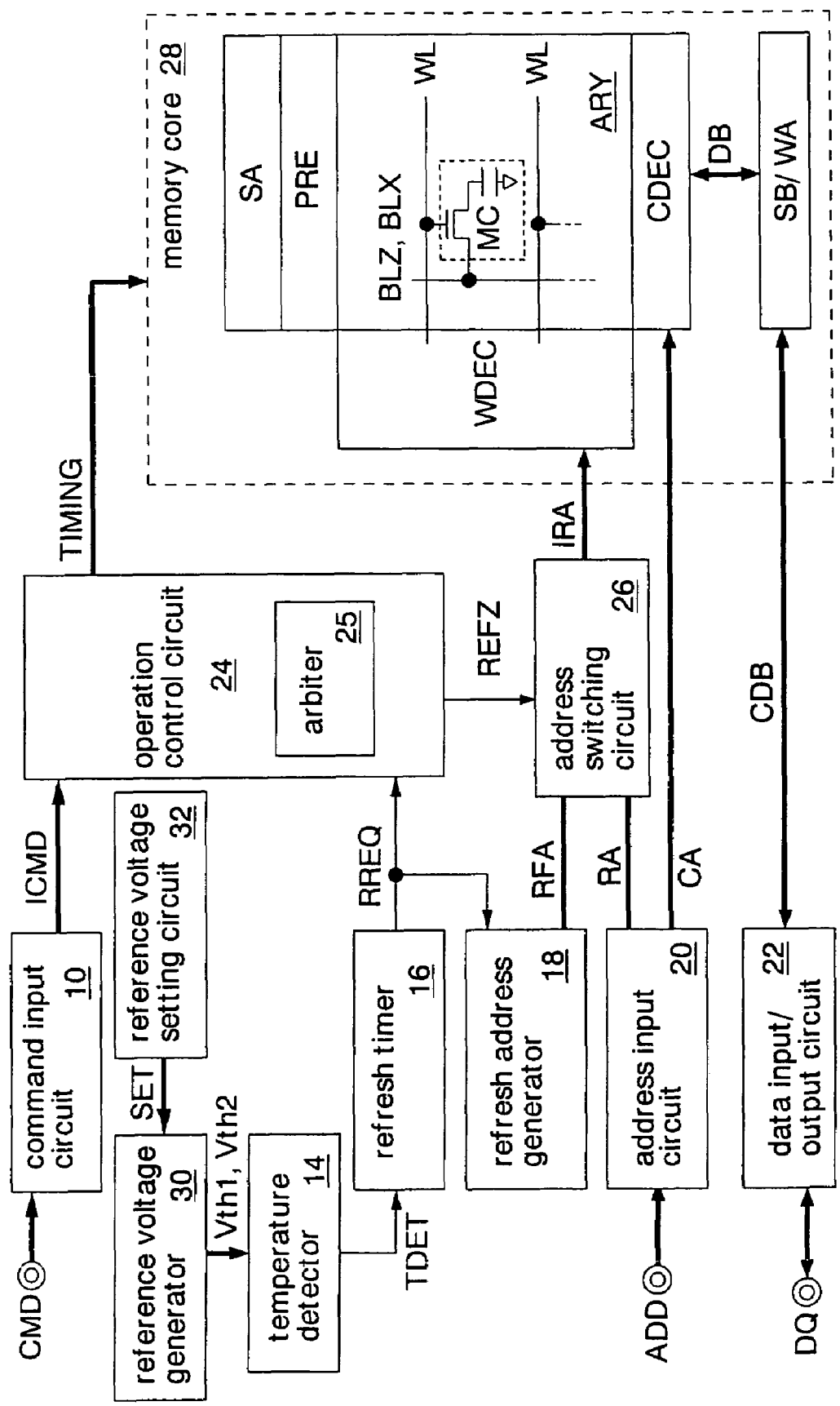
FIG. 8 is a block diagram showing a second embodiment of the semiconductor integrated circuit of the present invention.

FIG. 8 shows a second embodiment of the semiconductor integrated circuit of the present invention. The same reference numerals and symbols are used to designate the same elements as the elements explained in the first embodiment, and detailed explanation thereof will be omitted. The semiconductor integrated circuit of this embodiment is formed on a silicon substrate as a pseudo SRAM, using a CMOS process.

The pseudo SRAM has a reference voltage generator 30 in place of the reference voltage generator 12 of the first embodiment. Further, a reference voltage setting circuit 32 is additionally formed. The other configuration is substantially the same as that of the first embodiment.

The reference voltage setting circuit 32 outputs four-bit setting signals SET in order to initially set respective values of threshold voltages Vth1, Vth2 to be generated by the reference voltage generator 30. The logic of the setting signals SET is fixed during manufacturing processes of the pseudo SRAM. The reference voltage generator 30 generates the threshold voltages Vth1, Vth2 having values according to the logic of the setting signals SET.

Figure 9:
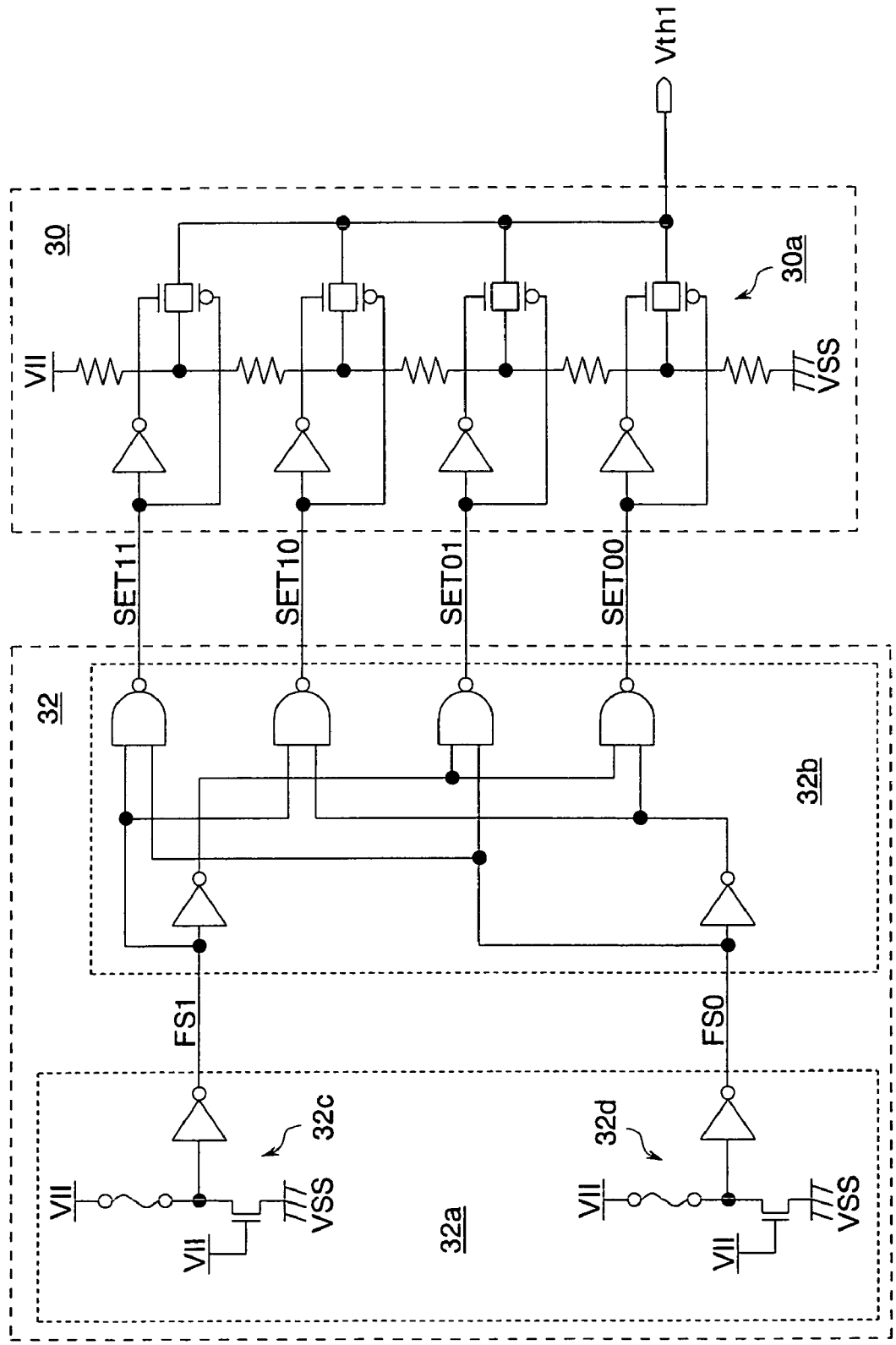
FIG. 9 is a circuit diagram showing a reference voltage setting circuit and a reference voltage generator shown in FIG. 8 in detail.

FIG. 9 shows the reference voltage setting circuit 32 and the reference voltage generator 30 shown in FIG. 8 in detail. In this example, only circuits for generating the threshold voltage Vth1 are shown. The pseudo SRAM has the same circuits as those in FIG. 9 for generating the threshold voltage Vth2.

The reference voltage setting circuit 32 has a ROM circuit 32a that outputs fuse signals FS1, FS0 whose logic is fixed during the manufacturing processes of the pseudo SRAM and a decoder 32b that decodes the fuse signals FS1, FS0 and outputs the setting signals SET (SET11, SET10, SET01, SET00). The ROM circuit 32a has two ROM units 32c, 32d. Each of the ROM units 32c, 32d has a fuse and an nMOS transistor that are connected in series between an internal power supply line VII and a ground line VSS, and an inverter connected to a connecting node of the fuse and the nMOS transistor. The nMOS transistor is connected to the internal power supply line VII at a gate thereof to be constantly on and functions as a high-resistance resistor.

The ROM unit (32c or 32d) where the fuse exists outputs the fuse signal (FS1 or FS0) at low level. The ROM unit (32c or 32d) where the fuse has blown out outputs the fuse signal (FS1 or FS0) at high level. Each of the two fuses is blown out or not blown out according to manufacturing specifications in the manufacturing processes of the pseudo SRAM, so that the decoder 32b sets only one of the setting signals to low level. Note that the tail numbers of the setting signals SET11, SET10, SET01, SET00 represent the logic of the fuse signals FS1, FS0. For example, when the logic of the fuse signals FS1, FS0 is "10" in the binary number, the setting signal SET10 maintains low level and the other setting signals SET11, SET01, SET00 maintain high level.

The reference voltage generator 30 has a plurality of resistors connected in series between the internal power supply line VII and the ground line VSS and also has a switch circuit 30a for connecting one of connecting nodes of the adjacent two resistors to an output node of the threshold voltage Vth1. The switch circuit 30a is constituted of a plurality of sets of a CMOS transmission gate and an inverter, and when the setting signal SET is at low level, the corresponding CMOS transmission gate turns on. In this example, four kinds of the threshold voltages Vth1 are generated according to the logic of the setting signals SET (SET11, SET10, SET01, SET00). The resistance values are set according to the four generated threshold voltages Vth1 respectively.

This embodiment has described an example where the reference voltage generator 30 is formed for each of the threshold voltages Vth1, Vth2. However, the plural resistors connected in series between the internal power supply line VII and the ground line VSS may be used in common for generating the threshold voltages Vth1, Vth2, thereby generating the threshold voltages Vth1, Vth2 using one reference voltage generator.

The same effects as those in the above-described first embodiment are also obtainable in this embodiment. Moreover, in this embodiment, the reference voltage setting circuit 32 and the switch circuit 30a enable the generation of the plural kinds of the threshold voltages Vth1, Vth2. Consequently, a pseudo SRAM having an optimum characteristic can be manufactured according to the fluctuation in manufacturing conditions or according to product specifications (power consumption specifications).

Figure 10:
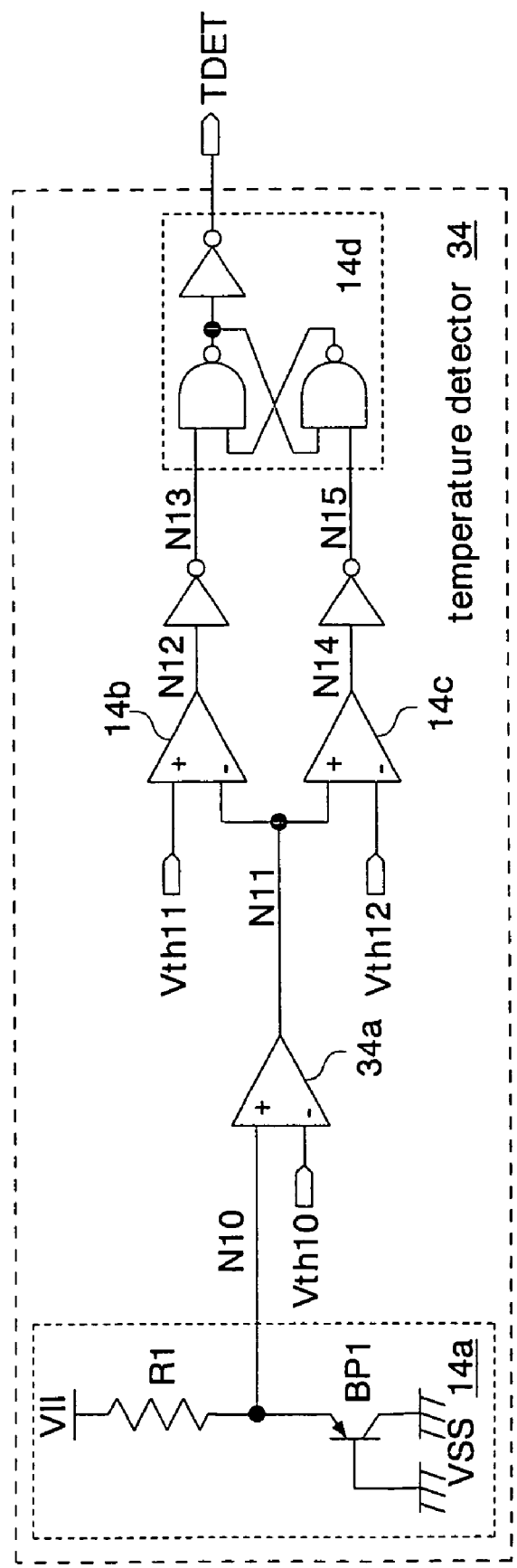
FIG. 10 is a circuit diagram showing an essential part of a third embodiment of the semiconductor integrated circuit of the present invention.

FIG. 10 shows an essential part of a third embodiment of the semiconductor integrated circuit of the present invention. The same reference numerals and symbols are used to designate the same elements as the elements explained in the first embodiment, and detailed explanation thereof will be omitted. In this embodiment, a temperature detector 34 is different from the temperature detector 14 of the first and second embodiments. The other configuration is substantially the same as that of the first and second embodiments. Therefore, only the temperature detector 34 is shown in FIG. 10.

The temperature detector 34 is constituted of the temperature detector 14 shown in FIG. 5 plus a basic differential amplifier 34a. The basic differential amplifier 34a is disposed between a connecting node N10 of a resistor R1 and a bipolar transistor BP1 and an input node N11 of differential amplifiers 14b, 14c. The basic differential amplifier 34a compares a preset threshold voltage Vth10 (basic reference voltage) and a detection voltage N10 to output the comparison result as a basic detection voltage N11. The differential amplifier 14b compares a threshold voltage Vth11 and the basic detection voltage N11. The differential amplifier 14c compares the basic detection voltage N11 and a threshold voltage Vth12.

Figure 11:
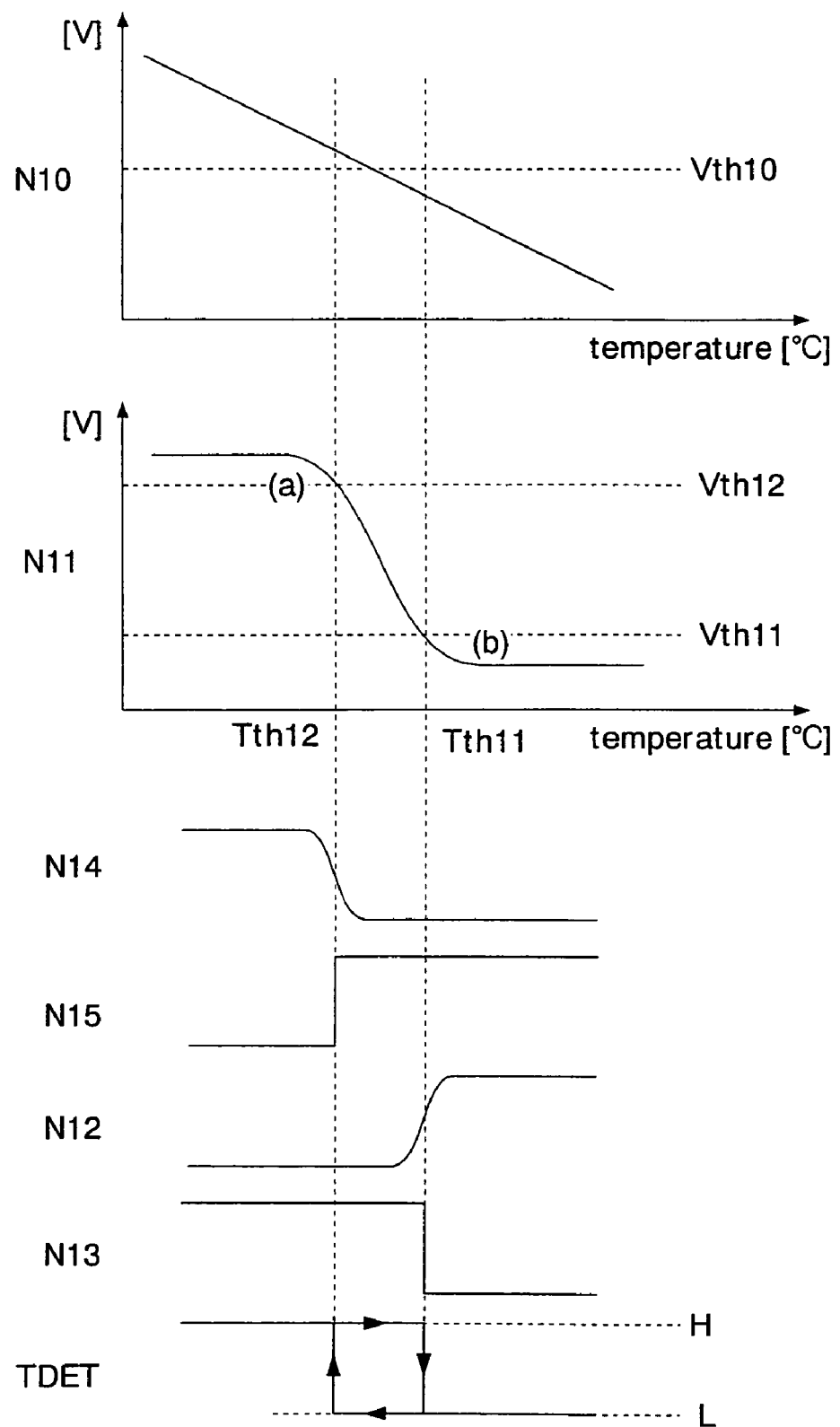
FIG. 11 is a waveform chart showing the operation of a temperature detector shown in FIG. 10.

FIG. 11 shows the operation of the temperature detector 34 shown in FIG. 10. The basic detection voltage N11 changes to high level when the detection voltage N10>the threshold voltage Vth10 (FIG. 11 (a)), and in a converse state, changes to low level (FIG. 11 (b)). Here, the threshold voltage Vth10 is set to a median value of the threshold voltages Vth1, Vth2.

The operations of the differential amplifiers 14b, 14c receiving the basic detection voltage N11 and a flipflop 14d are the same as those in the first embodiment (FIG. 6). In this embodiment, the differential amplifiers 14b, 14c receive the detection voltage N10 generated by a temperature detecting unit 14a via a differential amplifier 34a. Therefore, the detection voltage N10 that gently changes can be converted to the basic detection voltage N11 that steeply changes. This makes it possible to make a steep voltage change at nodes N14, N12 compared with that in the first embodiment.

The same effects as those of the above-described first embodiment are also obtainable in this embodiment. Moreover, in this embodiment, since the voltage change of the nodes N14, N12 can be made steep, a temperature detection signal TDET can be surely generated even when fluctuation in manufacturing conditions cause variances in characteristics of the differential amplifiers 14b, 14c and the variances cause an offset voltage. As a result, it is possible to prevent malfunction of the temperature detector 34 and to thereby surely generate the temperature detecting signal TDET even in a pseudo SRAM whose specification is such that the threshold voltages Vth12, Vth11 (boundary temperatures Tth1, Tth2) are close to each other. Alternatively, even when the threshold voltages Vth12, Vth11 vary due to fluctuation of manufacturing conditions, it is possible to surely generate the temperature detecting signal TDET.

Figure 12:
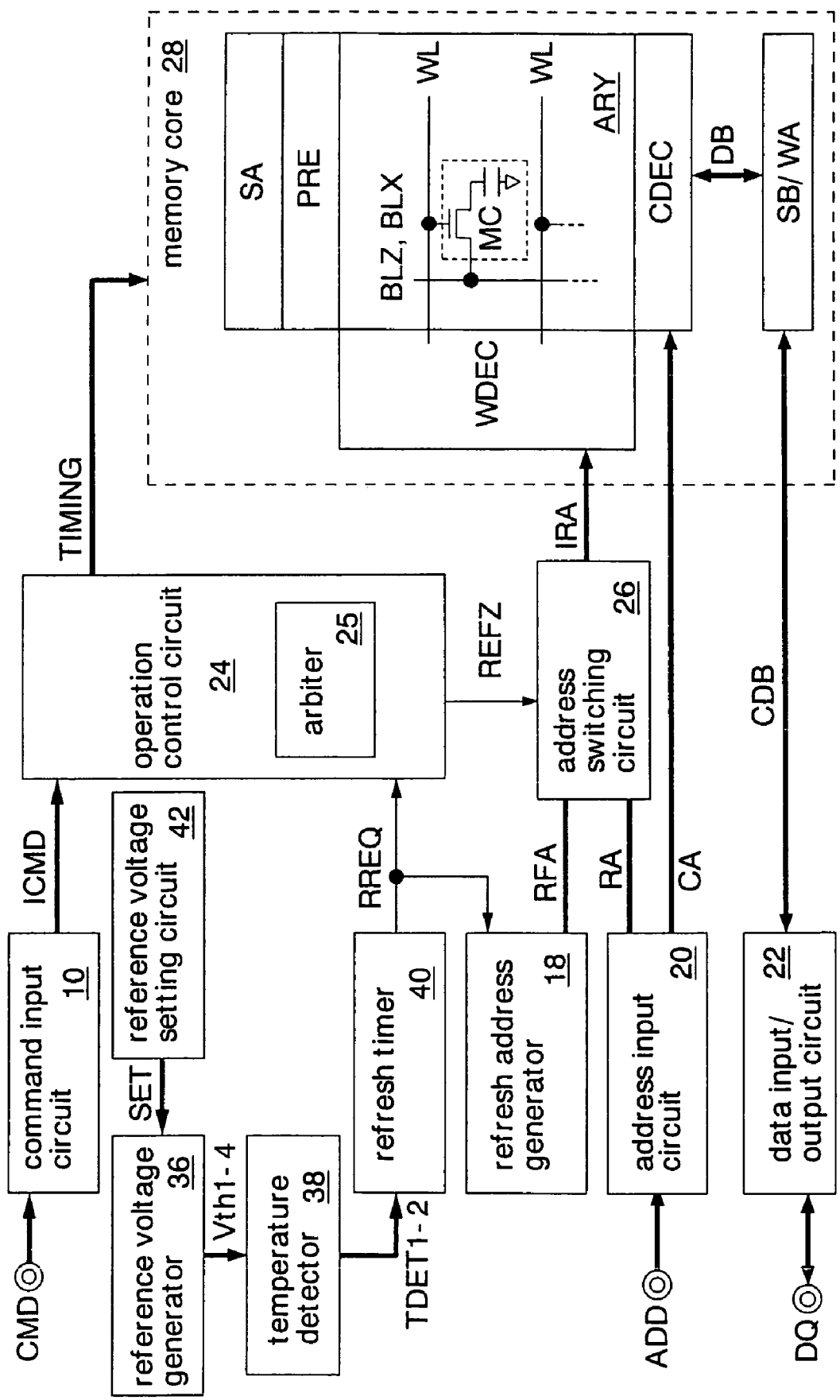
FIG. 12 is a block diagram showing a fourth embodiment of the semiconductor integrated circuit of the present invention.

FIG. 12 shows a fourth embodiment of the semiconductor integrated circuit of the present invention. The same reference numerals and symbols are used to designate the same elements as the elements explained in the first and second embodiments, and detailed explanation thereof will be omitted. The semiconductor integrated circuit of this embodiment is formed on a silicon substrate as a pseudo SRAM, using a CMOS process.

The pseudo SRAM has a reference voltage generator 36, a temperature detector 38, a refresh timer 40, and a reference voltage setting circuit 42 in place of the reference voltage generator 30, the temperature detector 14, the refresh timer 16, and the reference voltage setting circuit 32 of the second embodiment. The other configuration is substantially the same as that of the second embodiment.

The reference voltage generator 36 generates four threshold voltages Vth1, Vth2, Vth3, Vth4 corresponding to boundary temperatures Tth1, Tth2, Tth3, Tth4. The temperature detector 38 compares a voltage detected according to the chip temperature of the pseudo SRAM with the threshold voltages Vth1-4 to output 2-bit temperature detecting signals TDET1-2 according to the comparison results. The refresh timer 40 changes the timer cycle according to the temperature detecting signals TDET1-2. This means that the generation interval (output frequency) of a refresh request signal RREQ is set according to the temperature detecting signals TDET1-2.

The reference voltage setting circuit 42 outputs 8-bit setting signals SET in order to initially set respective values of the threshold voltages Vth1-4 to be generated by the reference voltage generator 36. 2 bits of the setting signals SET are used to make the initial setting of each of the threshold voltages Vth1-4. The logic of the setting signals SET is fixed during manufacturing processes of the pseudo SRAM as in the second embodiment.

Figure 13:
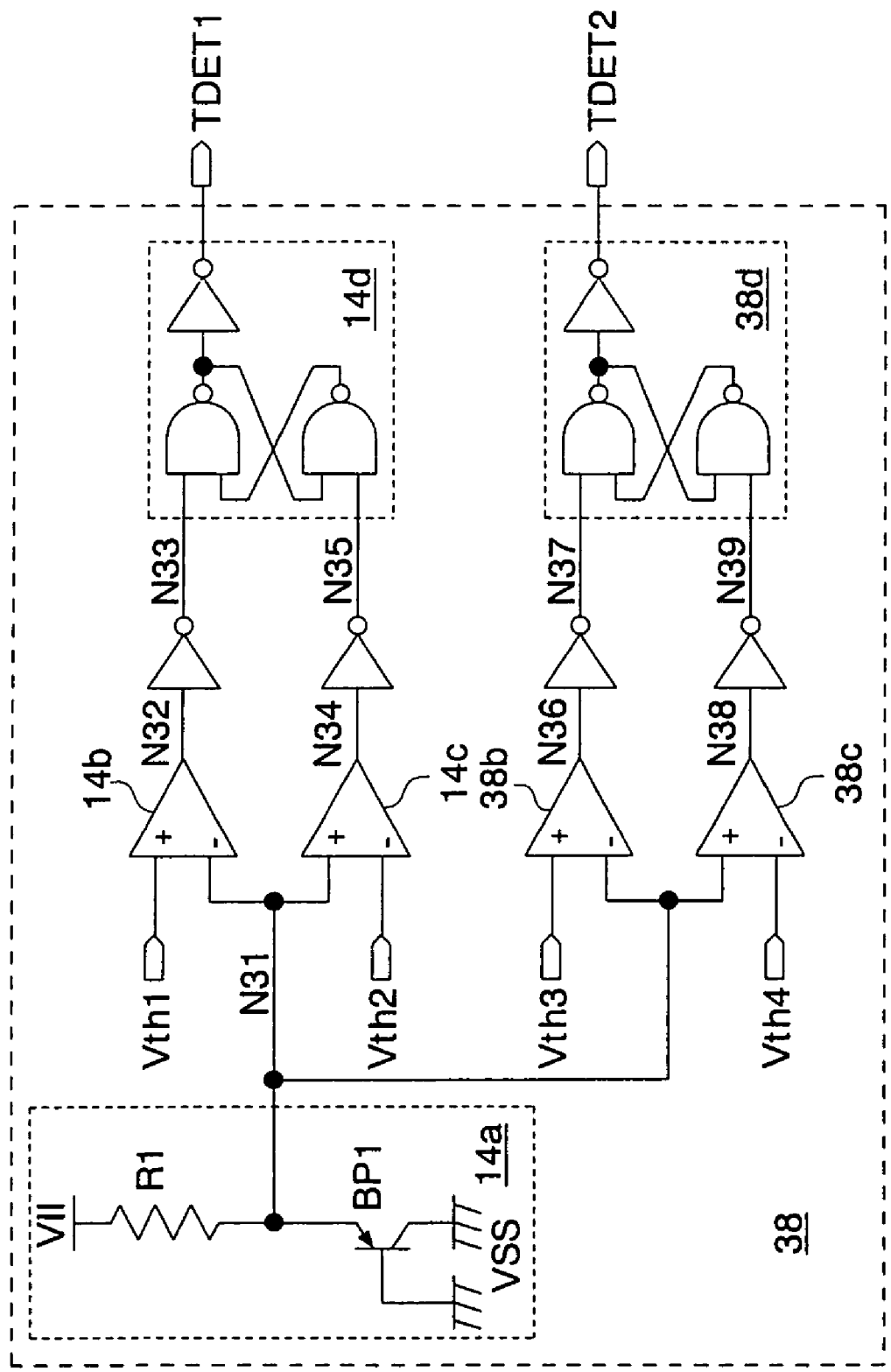
FIG. 13 is a circuit diagram showing a temperature detector shown in FIG. 12 in detail.

FIG. 13 shows the temperature detector 38 shown in FIG. 12 in detail. A temperature detecting unit 14a, differential amplifiers 14b, 14c, and a flipflop 14d for generating the temperature detecting signal TDET1 are the same as those in the temperature detector 14 (FIG. 5) of the first embodiment. Further, the temperature detector 38 has differential amplifiers 38b, 38c and a flipflop 38d for generating the temperature detecting signal TDET2. An output (a detection voltage N31) of the temperature detecting unit 14a is inputted in common to the differential amplifiers 14b, 14c, 38b, 38c.

A generator for the temperature detecting signal TDET2 constituted of the differential amplifiers 38b, 38c, the flipflop 38d, and so on is the same as the generator for the temperature detecting signal TDET1 constituted of the differential amplifiers 14b, 14c, the flipflop 14d, and so on. The differential amplifier 38b compares the threshold voltage Vth3 and the detection voltage N31 to output the comparison result to an output node N36. The differential amplifier 38c compares the detection voltage N31 and the threshold voltage Vth4 to output the comparison result to an output node N38.

Figure 14:
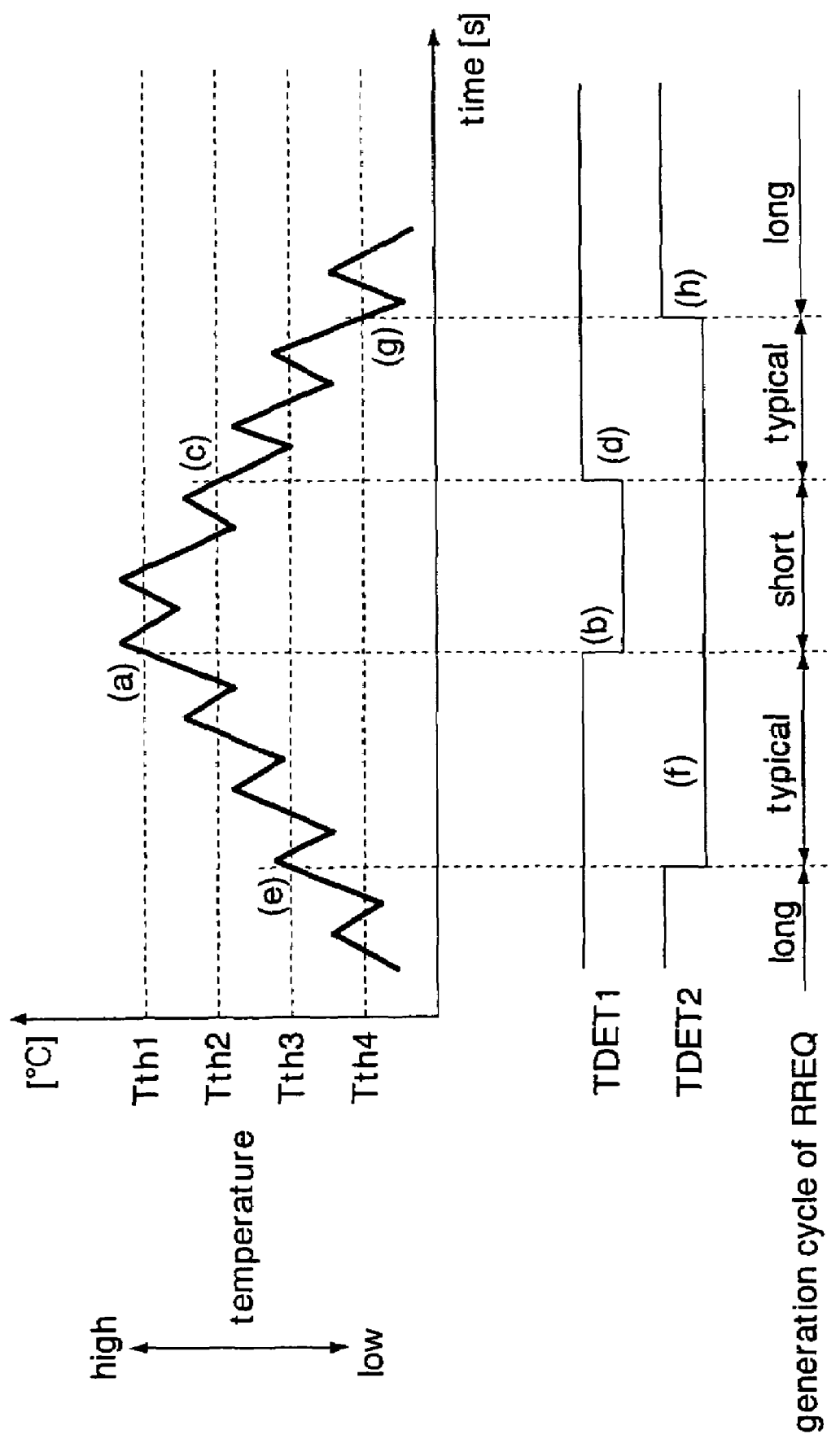
FIG. 14 is a waveform chart showing the operation of the temperature detector and a refresh timer according to variation in chip temperature in the fourth embodiment.

FIG. 14 shows the operation of the temperature detector 38 and the refresh timer 40 according to the change in the chip temperature. The temperature detector 38 sets the temperature detecting signal TDET1 to low level indicating a high temperature state when detecting that the chip temperature of the pseudo SRAM shifts from a low temperature to a high temperature to exceed the boundary temperature Tth1 (represented by the threshold voltage Vth1) (FIGS. 14 (a, b)). Therefore, the temperature detecting signal TDET1 changes from high level to low level only when the chip temperature exceeds the boundary temperature Tth2 and further exceeds Tth1. The temperature detector 38 sets the temperature detecting signal TDET1 to high level indicating a low temperature state when detecting that the chip temperature shifts from a high temperature to a low temperature to be lower than the boundary temperature Tth2 (represented by the threshold voltage Vth2) (FIGS. 14 (c, d)). Therefore, the temperature detecting signal TDET1 changes from low level to high level only when the chip temperature becomes lower than the boundary temperature Tth1 and further becomes lower than Tth2.

Further, the temperature detector 38 sets the temperature detecting signal TDET2 to low level indicating a high temperature state when detecting that the chip temperature of the pseudo SRAM shifts from a low temperature to a high temperature to exceed the boundary temperature Tth3 (FIGS. 14 (e, f)). Therefore, the temperature detecting signal TDET2 changes from high level to low level only when the chip temperature exceeds the boundary temperature Tth4 and further exceeds Tth3. The temperature detector 38 sets the temperature detecting signal TDET2 to high level indicating a low temperature state when detecting that the chip temperature shifts from a high temperature to a low temperature to be lower than the boundary temperature Tth4 (represented by the threshold voltage Vth4 (FIGS. 14 (g, h)). Therefore, the temperature detecting signal TDET2 changes from low level to high level only when the chip temperature becomes lower than the boundary temperature Tth3 and further becomes lower than Tth4.

The temperature detector 38 maintains the level of the temperature detecting signals TDET1-2 when the chip temperature is between the boundary temperatures Tth1, Tth2 and between the boundary temperatures Tth3, Tth4. Further, when the chip temperature fluctuates around the boundary temperature Tth1, the boundary temperature Tth2, the boundary temperature Tth3, and the boundary temperature Tth4, the level of the temperature detecting signals TDET1-2 does not change. The boundary temperatures are defined as Tth1>Tth2>Tth3>Tth4.

The refresh timer 40 sets the generation interval of a refresh request signal RREQ long when the logic values of the temperature detecting signals TDET1-2 are "11". The refresh timer 40 sets the generation interval of the refresh request signal RREQ to a standard value when the logic values of the temperature detecting signals TDET1-2 are "10". The refresh timer 40 sets the generation interval of the refresh request signal RREQ short when the logic values of the temperature detecting signals TDET1-2 are "00".

The same effects as those of the above-described first and second embodiments are also obtainable in this embodiment. Moreover, in this embodiment, the refresh frequency is delicately varied according to the chip temperature, which makes it possible to prevent unnecessary operation of the refresh timer 40 and so on and to further reduce the standby current.

Figure 15:
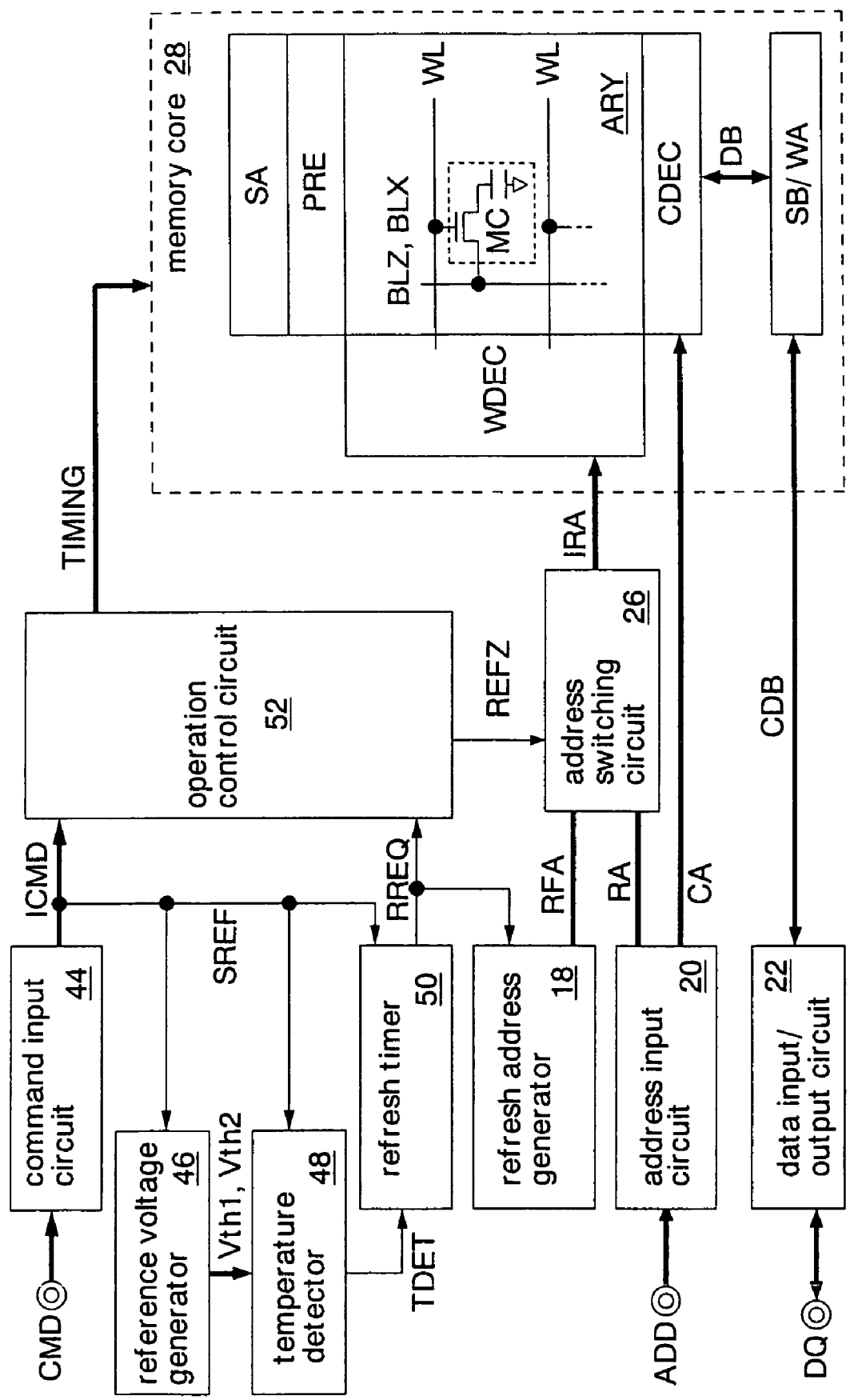
FIG. 15 is a block diagram showing a fifth embodiment of the semiconductor integrated circuit of the present invention.

FIG. 15 shows a fifth embodiment of the semiconductor integrated circuit of the present invention. The same reference numerals and symbols are used to designate the same elements as the elements explained in the first embodiment, and detailed explanation thereof will be omitted. The semiconductor integrated circuit of this embodiment is formed on a silicon substrate as a DRAM having a self-refresh function, using a CMOS process. The DRAM executes a read operation, a write operation, or a refresh operation (auto-refresh) in response to an external command CMD during a normal operation mode.

The DRAM executes the refresh operation during a self-refresh mode in response to a refresh request signal RREQ that is internally generated periodically. The DRAM is used as a work memory mounted on, for example, a notebook personal computer.

The DRAM has a command input circuit 44, a reference voltage generator 46, a temperature detector 48, a refresh timer 50, and an operation control circuit 52 in place of the command input circuit 10, the reference voltage generator 12, the temperature detector 14, the refresh timer 16, and the operation control circuit 24 of the first embodiment. The other configuration is substantially the same as that of the first embodiment.

During the normal operation mode, the command input circuit 44 (a command decoder) receives the command signal CMD (for example, a row address strobe signal /RAS, a column address strobe signal /CAS, a write enable signal /WE, or the like) supplied via a command terminal. The command input circuit 44 decodes the received command signal CMD (a read command, a write command, or an auto-refresh command) to output an internal command signal ICMD for having a memory core 28 execute a read operation, a write operation, or a refresh operation (auto-refresh).

Further, when receiving a self-refresh command via the command terminal CMD, the command input circuit 44 outputs a self-refresh signal SREF as the internal command signal ICMD for shifting a chip from the normal operation mode to the self-refresh mode. The command input circuit 44 does not accept access requests (the read command, the write command) and the auto-refresh command during the self-refresh mode.

The reference voltage generator 46, the temperature detector 48, and the refresh timer 50 are activated for operation while receiving the self-refresh signal SREF. In other words, these circuits 46, 48, 50 stop operating during the normal operation mode. The circuits unnecessary during the normal operation mode stop operating, which enables reduction in power consumption of the DRAM. The basic functions of the reference voltage generator 46, the temperature detector 48, and the refresh timer 50 are the same as those of the reference voltage generator 12, the temperature detector 14, and the refresh timer 16 of the first embodiment.

When receiving the read command, the write command, or the auto-refresh command from the command input circuit 44 during the normal operation mode, the operation control circuit 52 outputs a timing signal TIMING for having a memory core 28 execute the read operation, the write operation, or the refresh operation. When receiving the refresh request signal RREQ during the self-refresh mode, the operation control circuit 52 outputs the timing signal TIMING for having the memory core 28 execute the refresh operation. The operation of the operation control circuit 52 is the same as that of the operation control circuit 24 of the first embodiment. In this embodiment, however, a read request or a write request does not conflict with a refresh request. Therefore, the operation control circuit 52 does not have an arbiter.

The same effects as those of the above-described first embodiment are also obtainable in this embodiment. Moreover, in this embodiment, the standby current (self-refresh current) can be reduced also in the DRAM having the self-refresh mode.

Figure 16:
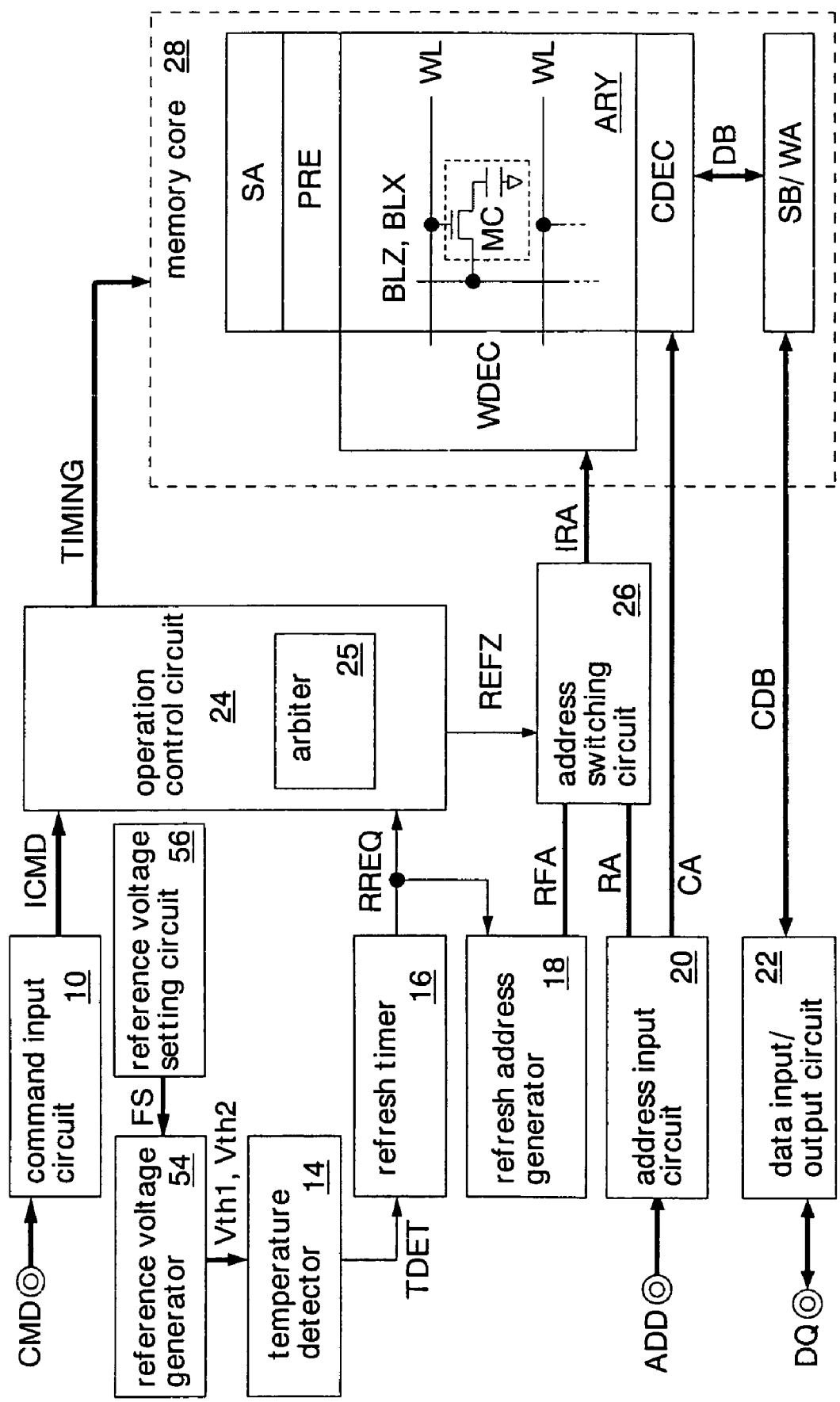
FIG. 16 is a block diagram showing a sixth embodiment of the semiconductor integrated circuit of the present invention.

FIG. 16 shows a sixth embodiment of the semiconductor integrated circuit of the present invention. The same reference numerals and symbols are used to designate the same elements as those explained in the first and second embodiments, and detailed explanation thereof will be omitted. The semiconductor integrated circuit of this embodiment is formed on a silicon substrate as a pseudo SRAM, using a CMOS process.

The pseudo SRAM has a reference voltage generator 54 and a reference voltage setting circuit 56 in place of the reference voltage generator 30 and the reference voltage setting circuit 32 of the second embodiment. The other configuration is the same as that of the second embodiment.

The reference voltage setting circuit 56 outputs three-bit fuse signals FS in order to make initial setting of respective values of threshold voltages Vth1, Vth2 to be generated by the reference voltage generator 54. The logic of the fuse signals FS is fixed in a manufacturing process of the pseudo SRAM. The reference voltage generator 54 generates the threshold voltages Vth1, Vth2 according to the logic of the fuse signal FS, as in the second embodiment.

Figure 17:
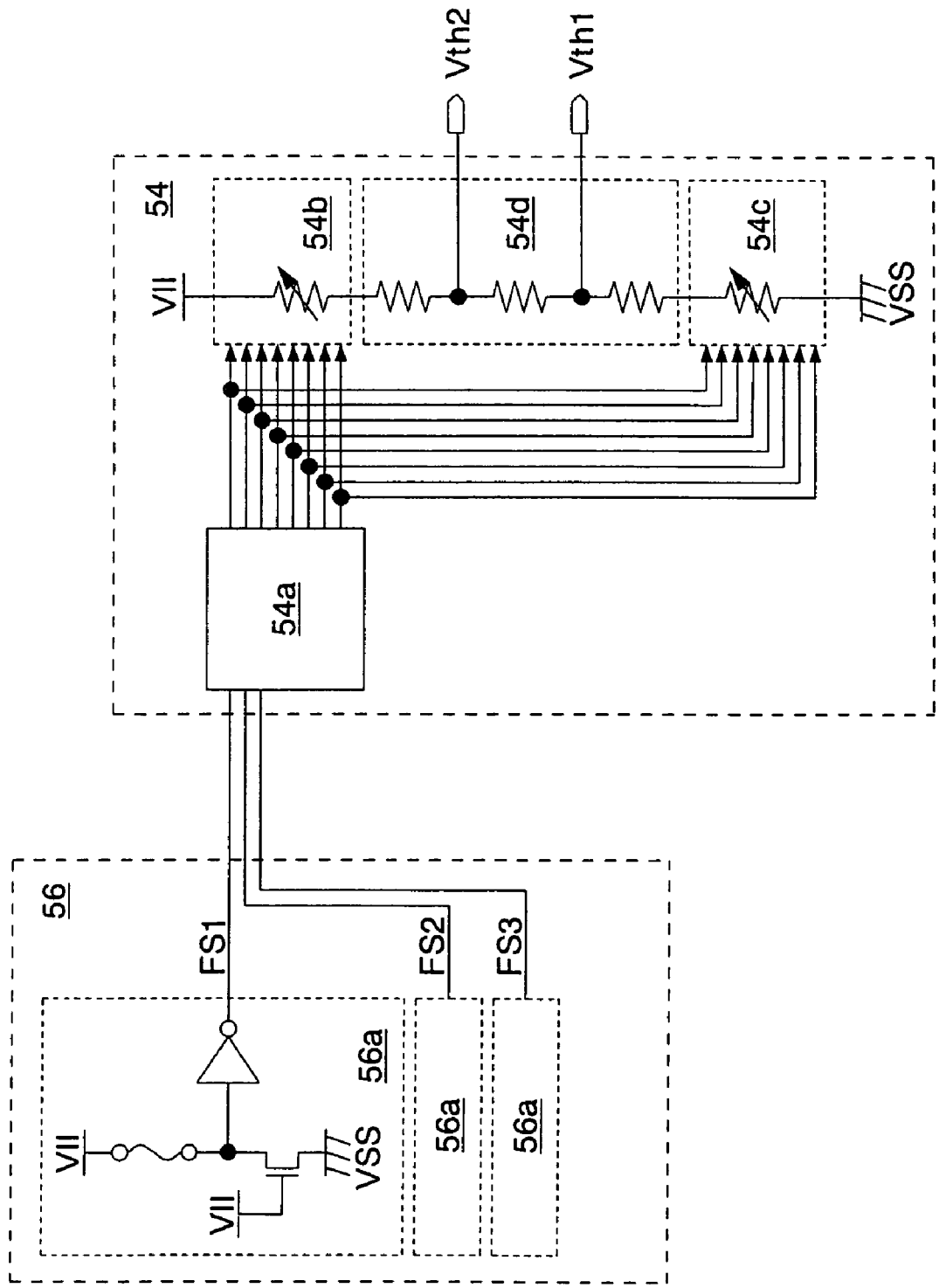
FIG. 17 is a circuit diagram showing in detail a reference voltage setting circuit and a reference voltage generator shown in FIG. 16.

FIG. 17 shows in detail the reference voltage setting circuit 56 and the reference voltage generator 54 shown in FIG. 16. The reference voltage setting circuit 56 has ROM units 56a (ROM circuits) that output the fuse signals FS (FS1-3), respectively, whose logics are fixed in the manufacturing process of the pseudo SRAM. The configuration of the ROM units 56a is the same as that of the ROM units 32c, 32d of the second embodiment (FIG. 9).

The reference voltage generator 54 has a decoder 54a, variable resistors 54b, 54c (variable resistor unit), and a resistor array 54d constituted of three resistors connected in series. The decoder 54a decodes the logic of the three-bit fuse signals FS1-3, activates one of eight-bit decoded signals, and deactivates the other decoded signals. The eight-bit decoded signals are supplied commonly to both the variable resistors 54b, 54c.

The variable resistor 54b (first variable resistor), the resistor array 54d, and the variable resistor 54c (second variable resistor) are connected in series between an internal power supply line VII and a ground line VSS. The threshold voltage Vth1 (or Vth2) is generated from a connecting node of two adjacent resistors of the resistor array 54d.

Resistance values of the variable resistors 54b, 54c are set according to the activated decoded signal. Here, the resistance values of the variable resistors 54b, 54c are set such that the sum thereof is to be a constant value irrespective of the activated decoded signal. That is, if the resistance value of the variable resistor 54b increases by a certain value, the resistance value of the variable resistor 54c decreases by the same value. Therefore, the sum of the resistance values of the variable resistor 54b, the resistor array 54d, and the variable resistor 54c is unchanged. This makes it possible to keep constant a value of current flowing through these resistors, so that a difference between the threshold voltages Vth1, Vth2 can be constant. The constant voltage difference makes always constant a temperature difference between boundary temperatures Tth1, Tth2 at which a temperature detector 14 changes the level of a temperature detecting signal TDET, which facilitates designing of the temperature detector 14.

Note that the threshold voltages Vth1, Vth2 drop by increasing the resistance value of the variable resistor 54b and decreasing the resistance value of the variable resistor 54c. Similarly, the threshold voltages Vth1, Vth2 rise by decreasing the resistance value of the variable resistor 54b and increasing the resistance value of the variable resistor 54c.

Figure 18:
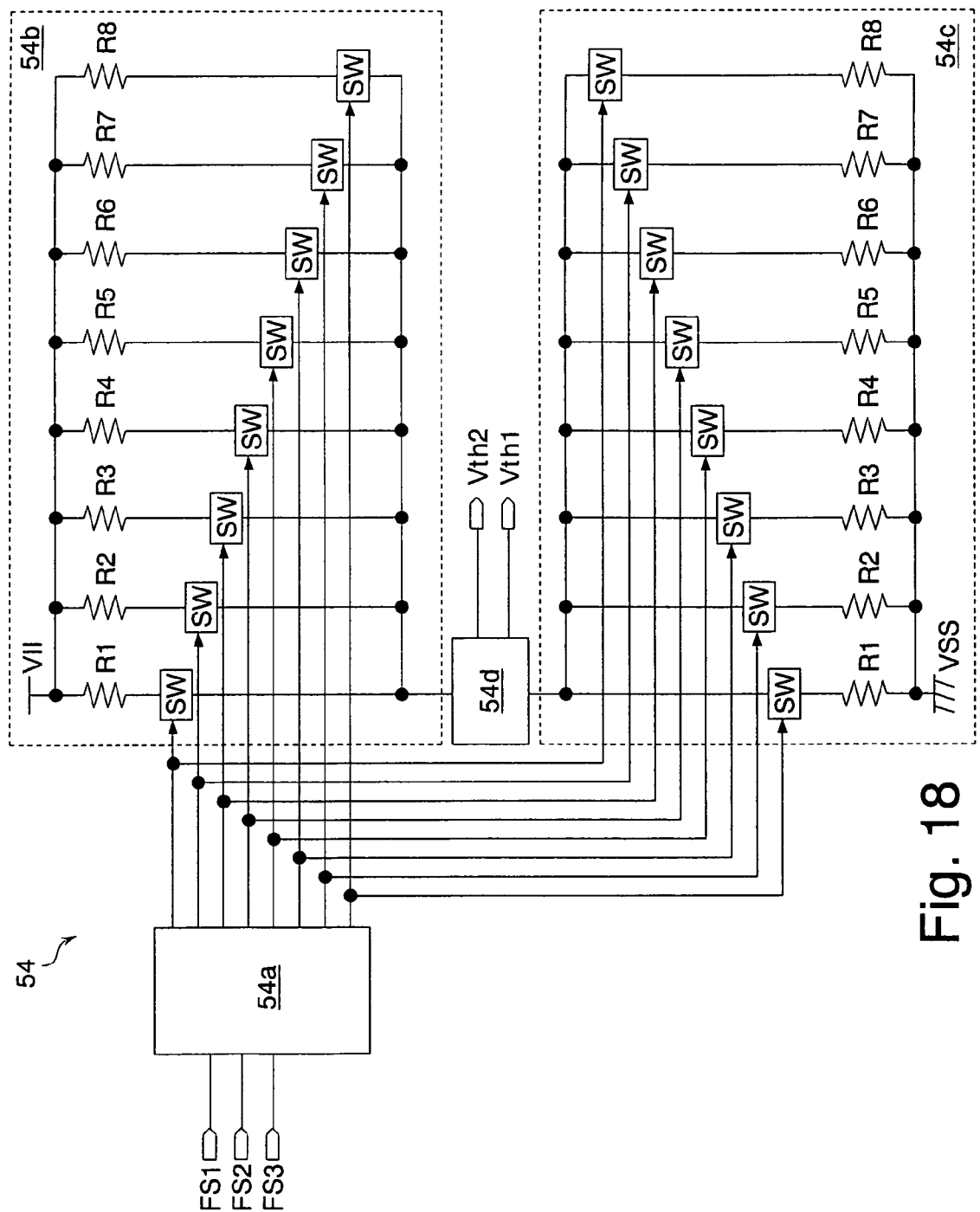
FIG. 18 is a circuit diagram showing an example of the reference voltage generator shown in FIG. 17.

FIG. 18 shows an example of the reference voltage generator 54 shown in FIG. 17. The variable resistor 54b has resistors R1 to R8 connected in parallel between the internal power supply line VII and the resistor array 54d, and switches SW connected in series to the respective resistors R1 to R8. Each of the switches SW receives one of the decoded signals from the decoder 54a. The switch SW receiving the activated decoded signal turns on and the other switches SW turn off. Consequently, one of the resistors R1 to R8 is connected to the resistor array 54d. The resistors R1 to R8 increase in resistance value in order of the resistor number. The resistors R1 to R8 are designed so that differences in the resistance values between adjacent resistors (for example, R1 and R2, or R5 and R6) are all equal.

The structure of the variable resistor 54c is the same as that of the variable resistor 54b except that the switches SW receive the decoded signals in a reverse order. In this embodiment, the resistors R1, R8 of the variable resistors 54b, 54c are connected to the resistor array 54d, or the resistors R4, R5 of the variable resistors 54b, 54c are connected to the resistor array 54d, according to the decoded signals. Therefore, the sum of the resistance values of the variable resistors 54b, 54c is always constant as described above.

The same effects as those in the above-described first and second embodiments are also obtainable in this embodiment. Moreover, in this embodiment, since the variable resistors 54b, 54c are used to form the reference voltage generator 54, different threshold voltages Vth1 (or Vth2) can be generated from the same connecting node of the resistor array 54d. Therefore, the resistor array 54d need not be provided with a switch (for example, the switch circuit 30a in FIG. 9) for selecting the threshold voltage Vth1 (or Vth2), so that the resistor array 54d can be simplified in its structure.

The sum of the resistance values of the variable resistors 54b, 54c is made constant, which allows the threshold voltages Vth1, Vth2 to be increased or decreased with a constant voltage difference therebetween. Consequently, the temperature detector 14 can change the level of the temperature detecting signal TDET whenever a certain degree of temperature change occurs. This can facilitate designing of circuits involved in the temperature detection.

Figure 19:
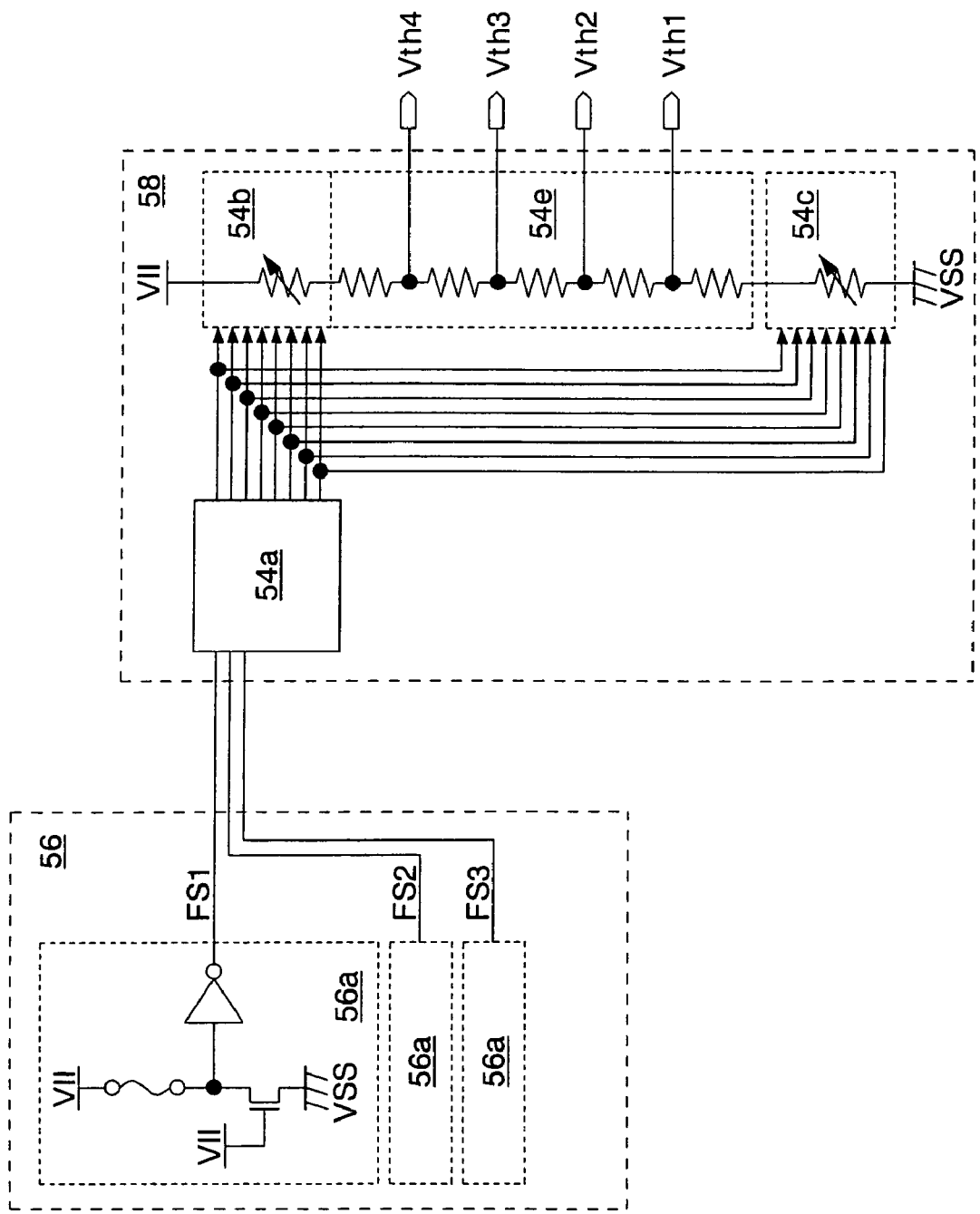
FIG. 19 is a circuit diagram showing an essential part of a seventh embodiment of the semiconductor integrated circuit of the present invention.

FIG. 19 shows an essential part of a seventh embodiment of the semiconductor integrated circuit of the present invention. The same reference numerals and symbols are used to designate the same elements as the elements explained in the first, fourth, and sixth embodiments, and detailed explanation thereof will be omitted. In this embodiment, a reference voltage setting circuit 56 and a reference voltage generator 58 are different from the reference voltage setting circuit 42 and the reference voltage generator 36 of the fourth embodiment. The other configuration is the same as that of the fourth embodiment. Therefore, FIG. 19 shows only the reference voltage setting circuit 56 and the reference voltage generator 58 out of circuits constituting the pseudo SRAM. Since the reference voltage setting circuit 56 is the same as in the sixth embodiment, detailed explanation thereof will be omitted.

The reference voltage generator 58 has a resistor array 54e in place of the resistor array 54d of the sixth embodiment. The other configuration is the same as the logical configuration of the reference voltage generator 54 of the six embodiment. The resistor array 54e has four resistors connected in series. A threshold voltage Vth1 (or Vth2, Vth3, Vth4) is generated from a connecting node of two adjacent resistors.

The same effects as those of the above-described first, second, fourth, and sixth embodiments are also obtainable in this embodiment.

Figure 20:
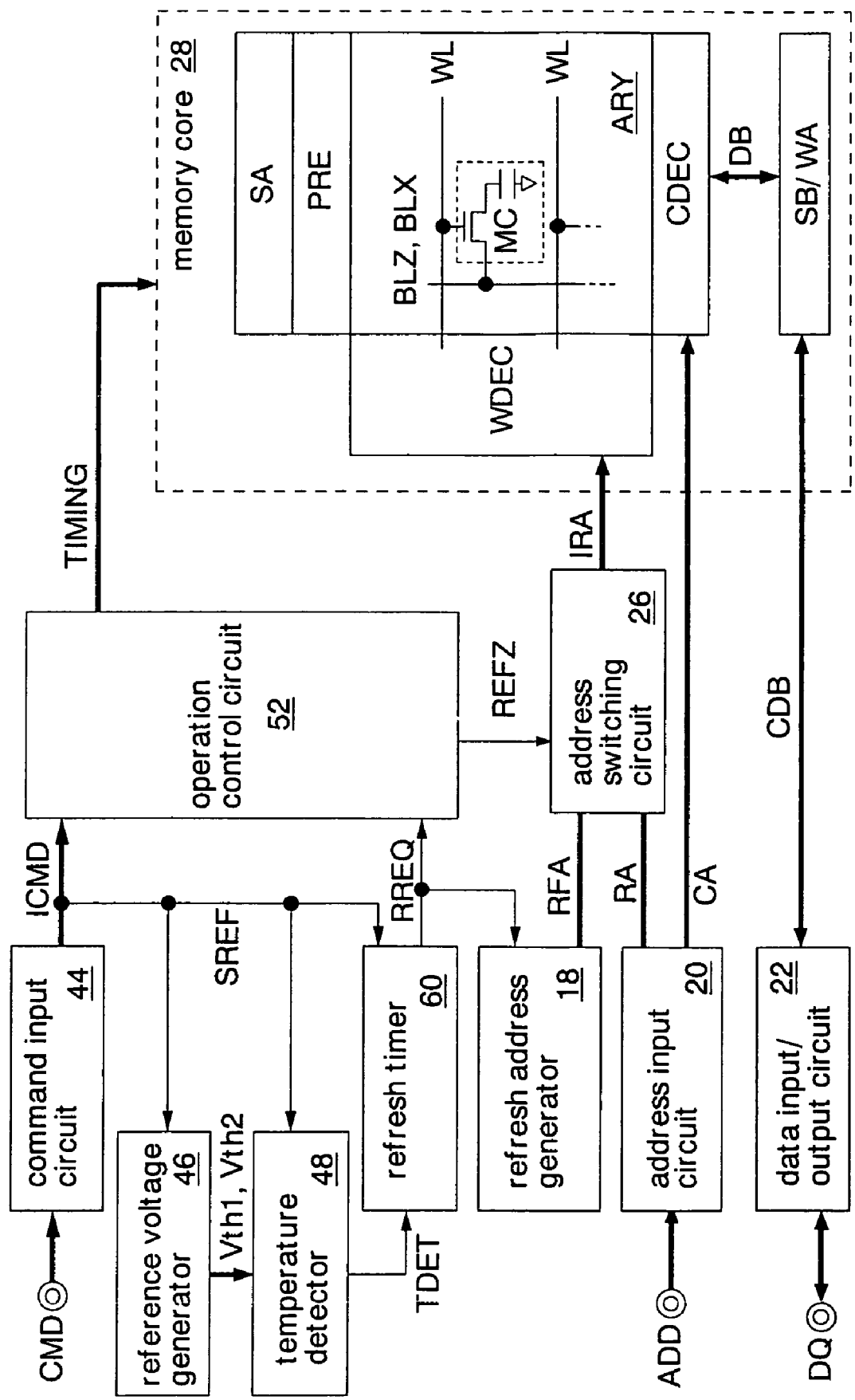
FIG. 20 is a block diagram showing an eighth embodiment of the semiconductor integrated circuit of the present invention.

FIG. 20 shows an eighth embodiment of the semiconductor integrated circuit of the present invention. The same reference numerals and symbols are used to designate the same elements as the elements explained in the first and fifth embodiments, and detailed explanation thereof will be omitted. The semiconductor integrated circuit of this embodiment is formed on a silicon substrate as a DRAM having a self-refresh function, using a CMOS process. The DRAM executes a read operation, a write operation, or a refresh operation (auto-refresh) in response to an external command CMD during a normal operation mode.

The DRAM executes the refresh operation during a self-refresh mode in response to a refresh request signal RREQ that is internally generated periodically. The DRAM is used as a work memory mounted on, for example, a notebook personal computer. The DRAM has a refresh timer 60 in place of the refresh timer 50 of the fifth embodiment. The other configuration is the same as that of the fifth embodiment.

A reference voltage generator 46, a temperature detector 48, and the refresh timer 60 are activated for operation while receiving a self-refresh signal SREF. In other words, these circuits 46, 48, 60 do not operate in the normal operation mode.

Further, the refresh timer 60 initially sets a generation cycle of the refresh request signal RREQ short irrespective of a chip temperature immediately after the DRAM shifts from the normal operation mode to the self-refresh mode. In other words, even when the chip temperature is lower than Tth2, the generation cycle of the refresh request signal RREQ does not get longer. The other operations are the same as those of the fifth embodiment. Immediately after the shift to the self-refresh mode, a power supply voltage inside the DRAM is sometimes in an unstable state, and so is an oscillation cycle of the refresh timer 60. The generation cycle of the refresh request signal RREQ is set to a shorter cycle until it is out of the unstable state, which can stabilize operation of the DRAM. In other words, it is possible to prevent loss of data retained in memory cells MC, resulting in improved reliability of the data retained in the memory cells MC.

Figure 21:
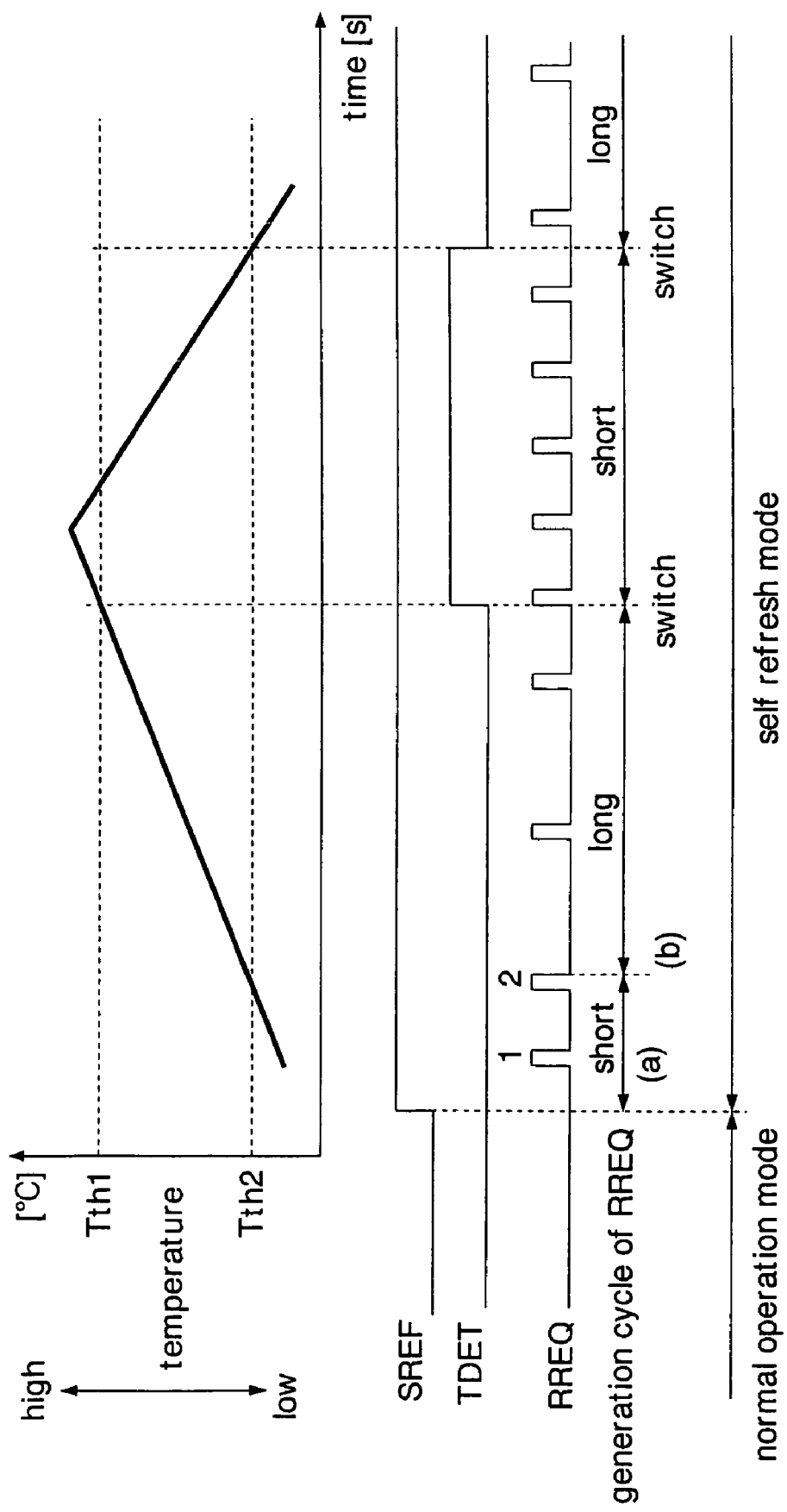
FIG. 21 is a waveform chart showing the operations of a temperature detector and a refresh timer in accordance with a change in chip temperature in the eighth embodiment.

FIG. 21 shows the operations of the temperature detector 48 and the refresh timer 60 in accordance with the change in the chip temperature in the eighth embodiment. The refresh timer 60 sets the generation cycle of the refresh request signal RREQ short irrespective of the chip temperature when the level of the self-refresh signal SREF changes from low level to high level and the DRAM shifts to the self-refresh mode (FIG. 21(*a*)). The refresh timer 60 changes the generation cycle of the refresh request signals RREQ depending on the chip temperature after generating the refresh request signal RREQ twice. (FIG. 21 (*b*)).

In this example, at the time of the shift from the normal operation mode to the self-refresh mode, the chip temperature is lower than Tth2. Therefore, the generation cycle of the refresh request signal RREQ is to be set long originally. However, shortening the generation cycle of the refresh request signal RREQ for a period immediately after the shift to the self-refresh mode until the internal operation of the DRAM is stabilized makes it possible to prevent loss of the data retained in the memory cells as described above.

The same effects as those in the above-described first and fifth embodiments are also obtainable in this embodiment. Moreover, in this embodiment, the refresh timer 60 keeps the generation cycle of the refresh request signal RREQ short for a predetermined period irrespective of the chip temperature after shifting to the self-refresh mode. Consequently, it is possible to surely refresh the memory cells MC during a period in which the internal operation is unstable immediately after the shift to the self-refresh mode, resulting in improved reliability of the data retained in the memory cells MC.

Figure 22:
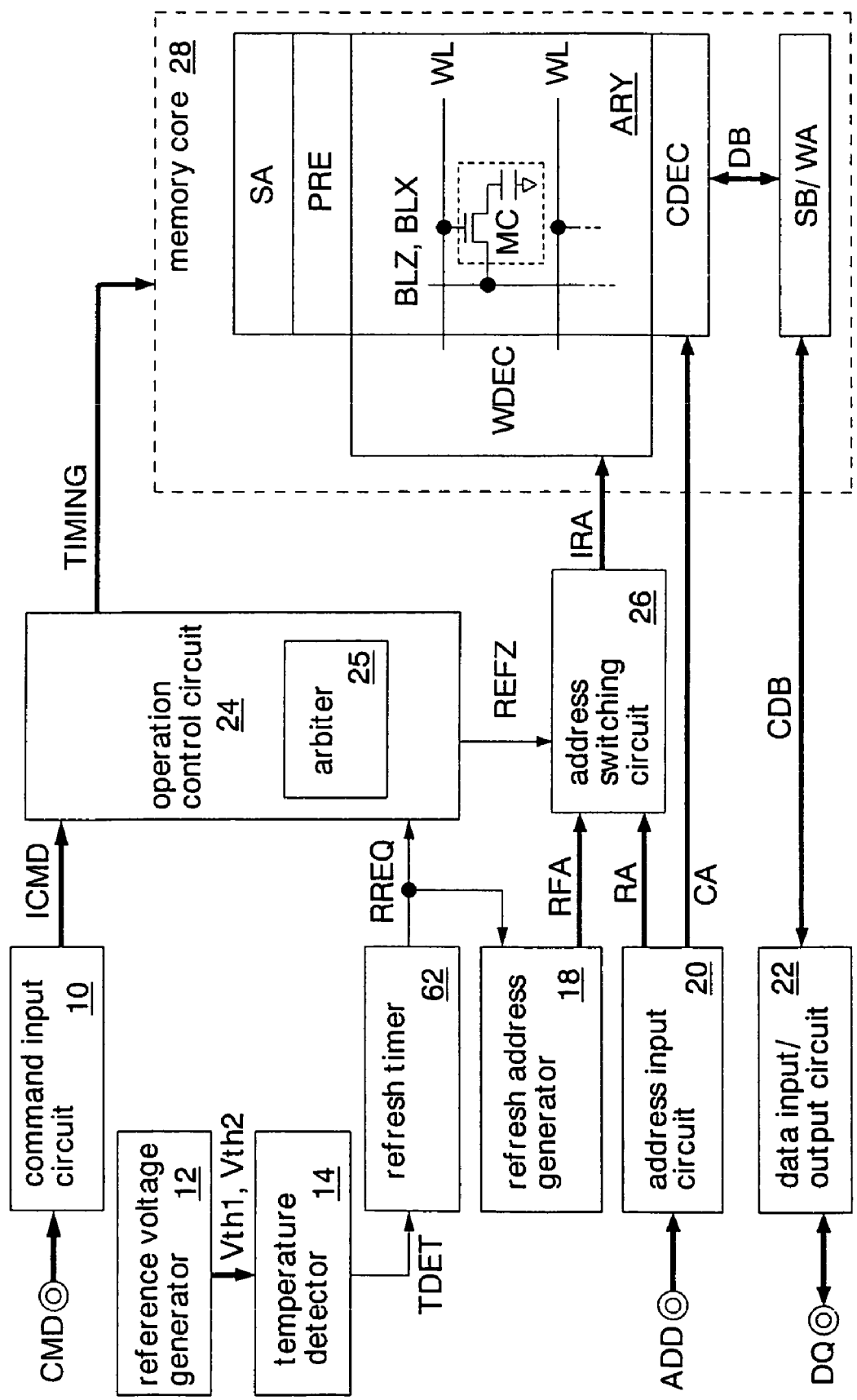
FIG. 22 is a block diagram showing a ninth embodiment of the semiconductor integrated circuit of the present invention.

FIG. 22 shows a ninth embodiment of the semiconductor integrated circuit of the present invention. The same reference numerals and symbols are used to designate the same elements as the elements explained in the first embodiment, and detailed explanation thereof will be omitted. The semiconductor integrated circuit of this embodiment is formed on a silicon substrate as a pseudo SRAM, using a CMOS process. The pseudo SRAM has a refresh timer 62 in place of the refresh timer 16 of the first embodiment. The other configuration is the same as that of the first embodiment.

The refresh timer 62 does not immediately change a generation cycle of a refresh request signal RREQ from a short cycle to a long cycle when the level of a temperature detecting signal TDET changes to high level due to the shift of the chip temperature from low to high. The generation cycle of the refresh request signal RREQ is changed to a long cycle after the refresh request signal is generated twice after the temperature detecting signal TDET changes. Data reliability is higher at a short refresh cycle than at a long refresh cycle. Delaying the shift timing when the shifting makes the data reliability lower makes it possible to prevent loss of data retained in memory cells MC even if a temperature detector 14 erroneously detects a temperature drop repeatedly due to power supply noises and the like. As a result, it is possible to improve reliability of the data retained in the memory cells MC and to surely prevent malfunction of the temperature detector and of the semiconductor integrated circuit.

The refresh timer 62 changes the generation cycle of the refresh request signal RREQ from long to short immediately when the level of the temperature detecting signal TDET changes to low level due to the shift of the chip temperature from low to high. Quickly switching the generation cycle when the shifting makes the data reliability higher makes it possible to prevent loss of the data retained in the memory cells MC as described above.

Figure 23:
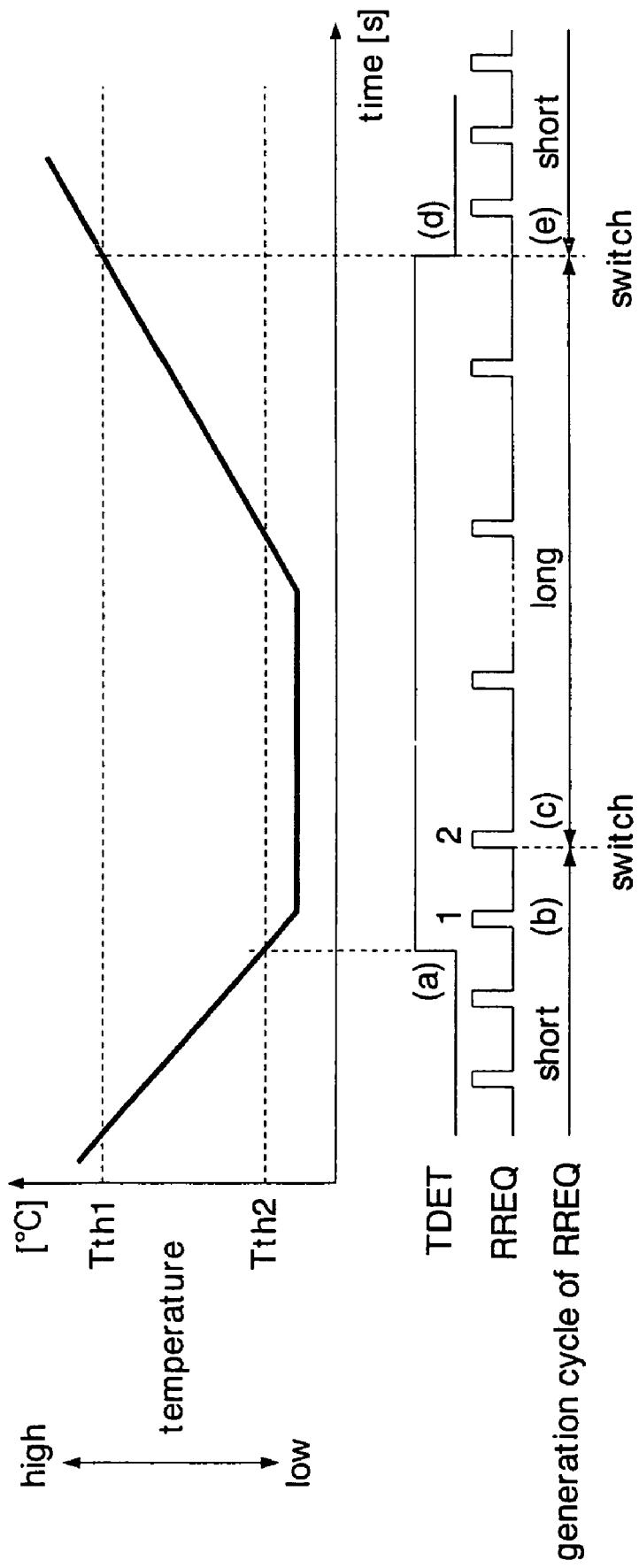
FIG. 23 is a waveform chart showing the operations of a temperature detector and a refresh timer in accordance with a change in chip temperature in the ninth embodiment.

FIG. 23 shows the operations of the temperature detector 14 and the refresh timer 62 in accordance with the change in the chip temperature in the ninth embodiment. The level of the temperature detecting signal TDET changes from low level to high level only when the chip temperature goes lower than a boundary temperature Tth1 and further goes lower than Tth2 (FIG. 23(*a*)). At this time, the refresh timer 62 does not immediately change the generation cycle of the refresh request signal RREQ but keeps it short (FIG. 23(*b*)). The refresh timer 62 sets the generation cycle of the refresh request signal RREQ long in response to the second generation of the refresh request signal RREQ after the level of the temperature detecting signal TDET changes to high level (FIG. 23(*c*)).

Meanwhile, the level of the temperature detecting signal TDET changes from high to low only when the chip temperature exceeds the boundary temperature Tth2 and further exceeds Tth1 (FIG. 23(*d*)). At this time, the refresh timer 62 sets the generation cycle of the refresh request signal RREQ short in synchronization with a falling edge of the temperature detecting signal TDET (FIG. 23(*e*)).

The same effects as those in the above-described first embodiment are also obtainable in this embodiment. Moreover, in this embodiment, the generation cycle of the refresh request signal RREQ is switched with a time lag since the level change in the temperature detecting signal TDET from low (high temperature) to high (low temperature). This makes it possible to surely prevent malfunction of the temperature detector 14 and of the pseudo SRAM even when the detection results of the temperature detector 14 greatly fluctuates due to power supply noises and the like. As a result, reliability of the data retained in the memory cells MC can be improved.

Note that the above-described embodiments have described examples where the present invention is applied to the pseudo SRAM chip and the DRAM chip. The present invention is, however, not to be limited to such embodiments. For example, the present invention may be applied to a pseudo SRAM core and a DRAM core mounted on a system LSI.

The above-described embodiments have described examples where the present invention is applied to the pseudo SRAM or the DRAM. The present invention is not to be limited to such embodiments. For example, the present invention may be applied to a logic LSI and the like in which the cycle of an internal clock signal is changed according to the chip temperature.

Further, the above-described second to fourth, sixth, seventh, and ninth embodiments may be applied to a DRAM instead of a pseudo SRAM.

The above-described second to fourth, sixth, and seventh embodiments have described examples where the ROM circuit having the fuses is used to make initial setting of the threshold voltages Vth1, Vth2, and others in a manufacturing process (for example, a test process) of the pseudo SRAM. However, the present invention is not limited to such embodiments. For example, signal lines of the fuse signals FS1 and so on may be directly connected to the power supply line VII or the ground line VSS by a bonding wire in a manufacturing process (for example, an assembly process) of the pseudo SRAM.

The foregoing second embodiment has described an example where the reference voltage setting circuit 32 and the reference voltage generator 30 are formed for generation of each of the threshold voltages Vth1, Vth2. However, the present invention is not limited to such an embodiment. For example, the reference voltage setting circuit 32 may be formed in common to the threshold voltages Vth1, Vth2 and the setting signals SET outputted from the reference voltage setting circuit 32 may be outputted in common to the reference voltage generators 30 corresponding to the respective threshold voltages Vth1, Vth2.

Figure 24:
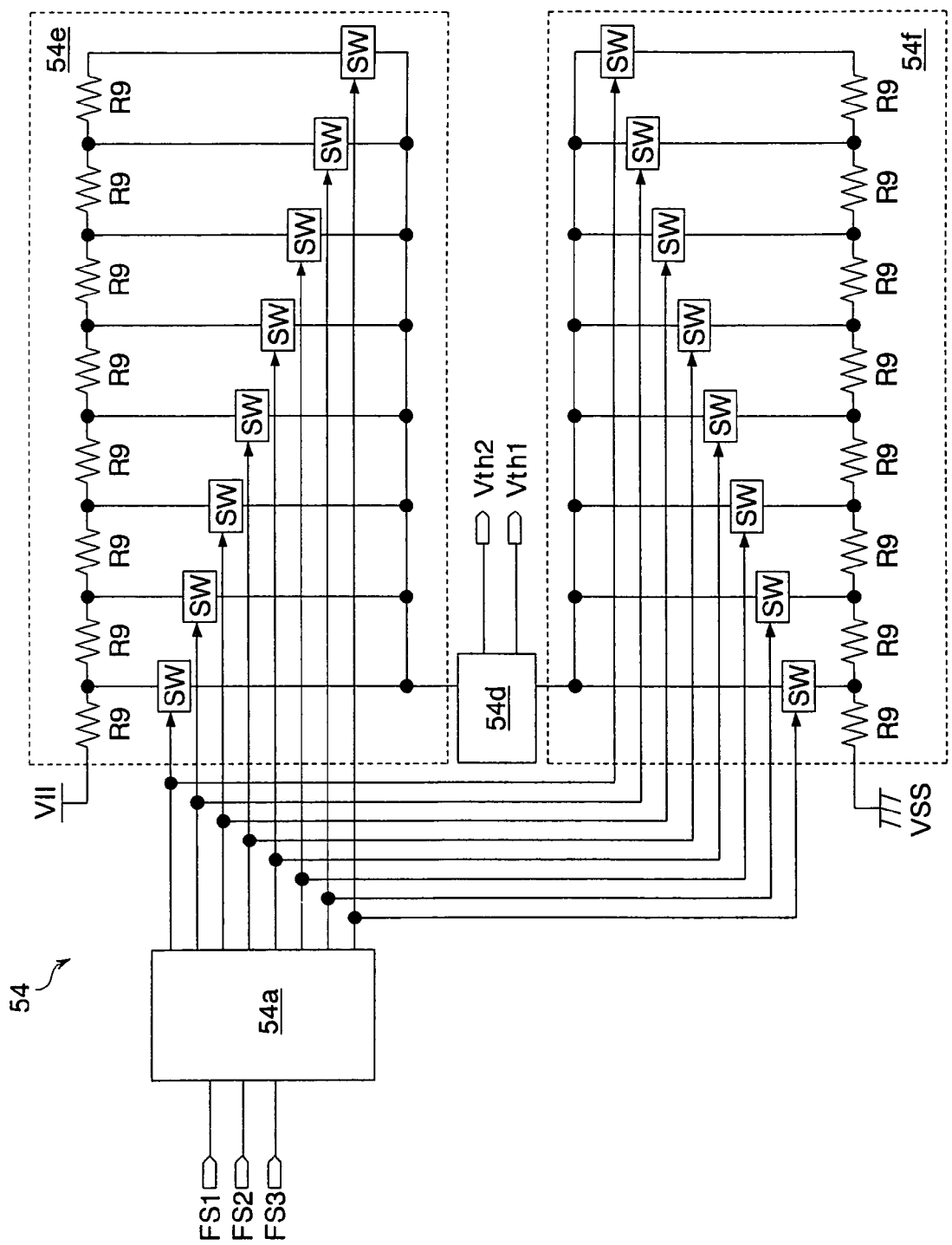
FIG. 24 is a circuit diagram showing another example of the reference voltage generator shown in FIG. 17.

The foregoing sixth embodiment has described an example where the resistors R1 to R8 are connected in parallel between the power supply line VII and the resistor array 54d and between the ground line VSS and the resistor array 54d to form the variable resistors 54b, 54c. However, the present invention is not limited to such an embodiment. For example, as shown in FIG. 24, a plurality of resistors R9 may be connected in series between the power supply line VII and the resistor array 54d and between the ground line VSS and the resistor array 54d to form variable resistors 54e, 54f. In this case, resistance values of the resistors R9 are all set to the same value. The nine resistors R9 are always connected between the power supply line VII and the ground line VSS, independent of an ON switch. The resistors R9 are manufactured by utilizing diffusion resistance or wiring resistance generally. Therefore, even when the manufacturing conditions fluctuate in the semiconductor manufacturing process, amounts of change in all the resistance values of the resistors R9 are the same. This enables all the manufactured resistors R9 to have the same resistance value. As a result, it is possible to keep constant the sum of the resistance values of the variable resistors 54e, 54f even when the manufacturing conditions fluctuate.

The invention is not limited to the above embodiments and various modifications may be made without departing from the spirit and scope of the invention. Any improvement may be made in part or all of the components.

What is claimed is:

1. A semiconductor integrated circuit chip comprising:
   a memory core to include a plurality of dynamic memory cells arranged in matrix;
   a reference voltage generator configured to generate a first boundary voltage corresponding to a first temperature and a second boundary voltage, which is different from the first boundary voltage, corresponding to a second temperature which is different from the first temperature;
   a temperature detector configured to generate a detection voltage corresponding to a chip temperature, the temperature detector being coupled to receive the first and second boundary voltages from the reference voltage generator and to compare the first and second boundary voltages with the detection voltage; and
   a refresh control circuit configured to set a refresh cycle of a refresh operation,
   wherein, when the chip temperature shifts from below the second temperature to above the first temperature, the refresh control circuit maintains the refresh cycle when the chip temperature exceeds the second temperature and sets the refresh cycle short when the chip temperature exceeds the first temperature, and
   wherein, when the chip temperature shifts from above the first temperature to below the second temperature, the refresh control circuit maintains the refresh cycle when the chip temperature falls from the first temperature and sets the refresh cycle short when the chip temperature falls from the second temperature.

2. The semiconductor integrated circuit according to claim 1, further comprising:
   a reference voltage setting circuit, coupled to the reference voltage generator, configured to output a first setting signal in order to set the first boundary voltage and to output a second setting signal in order to set the second boundary voltage.

3. The semiconductor integrated circuit according to claim 1, wherein the refresh control circuit maintains the refresh cycle of the refresh operation when the chip temperature is between the first temperature and the second temperature.

4. The semiconductor integrated circuit chip according to claim 1, wherein:
   the refresh control circuit controls the refresh cycle of the refresh operation without receiving an external command.

5. The semiconductor integrated circuit chip according to claim 1, further comprising:
   a command input circuit configured to receive a command signal supplied via a command terminal, decode the command signal and output an internal command signal in order to access the memory core.

6. A portable equipment comprising:
   a memory mounted on the portable equipment, the memory including a semiconductor integrated circuit that is formed on a silicon substrate, the semiconductor integrated circuit including:
   a memory core to include a plurality of dynamic memory cells arranged in matrix; and
   a reference voltage generator configured to generate a first boundary voltage corresponding a first temperature and a second boundary voltage, which is different from the first boundary voltage, corresponding a second temperature which is different from the first temperature;
   a temperature detector configured to generate a detection voltage corresponding to a chip temperature, the temperature detector is coupled to receive the first and second boundary voltages from the reference voltage generator and to compare the first and second boundary voltages with the detection voltage; and
   a refresh control circuit configured to set a refresh cycle of a refresh operation,
   wherein, when the chip temperature shifts from below the second temperature to above the first temperature, the refresh control circuit maintains the refresh cycle when the chip temperature exceeds the second temperature and sets the refresh cycle short when the chip temperature exceeds the first temperature, and
   wherein, when the chip temperature shifts from above the first temperature to below the second temperature, the refresh control circuit maintains the refresh cycle when the chip temperature falls from the first temperature and sets the refresh cycle short when the chip temperature falls from the second temperature.

7. The portable equipment according to claim 6 further comprising:
   a reference voltage setting circuit, coupled to a reference voltage generator, configured to output a first setting signal in order to set the first boundary voltage and output a second setting signal in order to set the second boundary.

8. The semiconductor integrated circuit chip according to claim 6 wherein:
   the refresh control circuit controls the refresh cycle of the refresh operation without receiving an external command.

9. The semiconductor integrated circuit chip according to claim 6 further comprising:
a command input circuit configured to receive a command signal supplied via a command terminal, decode the command signal, and output an internal command signal in order to access the memory core.

* * * * *